(12) United States Patent
Xiu

(10) Patent No.: US 9,008,261 B2
(45) Date of Patent: Apr. 14, 2015

(54) CIRCUITS AND METHODS FOR USING A FLYING-ADDER SYNTHESIZER AS A FRACTIONAL FREQUENCY DIVIDER

(71) Applicant: Liming Xiu, Plano, TX (US)

(72) Inventor: Liming Xiu, Plano, TX (US)

(73) Assignee: Liming Xiu, Plano, TX (US)

(*) Notice: Subject to any disclaimer, the term of this patent is extended or adjusted under 35 U.S.C. 154(b) by 0 days.

(21) Appl. No.: 13/741,118

(22) Filed: Jan. 14, 2013

(65) Prior Publication Data

US 2014/0197867 A1    Jul. 17, 2014

(51) Int. Cl.
| H03K 21/00 | (2006.01) |
| G06F 1/08 | (2006.01) |
| H03K 23/66 | (2006.01) |
| H03K 23/68 | (2006.01) |

(52) U.S. Cl.
CPC ................ *G06F 1/08* (2013.01); *H03K 23/667* (2013.01); *H03K 23/68* (2013.01)

(58) Field of Classification Search
None
See application file for complete search history.

(56) References Cited

U.S. PATENT DOCUMENTS

| 3,446,947 | A | * | 5/1969 | Overstreet, Jr. | 708/103 |
| 4,688,237 | A | * | 8/1987 | Brault | 377/48 |
| 6,671,341 | B1 | * | 12/2003 | Kinget et al. | 375/373 |
| 6,759,886 | B2 | * | 7/2004 | Nakanishi | 327/295 |
| 7,486,145 | B2 | * | 2/2009 | Floyd et al. | 331/1 A |
| 7,920,006 | B1 | * | 4/2011 | Keramat et al. | 327/291 |
| 7,965,808 | B2 | * | 6/2011 | Marutani | 377/47 |
| 8,456,203 | B2 | * | 6/2013 | Kondou | 327/115 |
| 2001/0022537 | A1 | * | 9/2001 | Melava et al. | 331/16 |
| 2003/0068003 | A1 | * | 4/2003 | Casagrande | 377/47 |
| 2003/0108143 | A1 | * | 6/2003 | Han et al. | 377/47 |

OTHER PUBLICATIONS

J. Jin, X. Liu, T. Mo and J. Zhou; "Quantization Noise Suppression in Fractional-PLLs Utilizing Glitch-Free Phase Switching Multi-Modulus Frequency Divider"; JSSC; vol. 59, No. 5, pp. 926-937; May 2012.

J. L. Li, S. W. Qu, and Q. Xue; "A Theoretical and Experimental Study of Injection-Locked Fractional Frequency Dividers"; IEEE Trans. on Microwave Theory and Techniques; vol. 56 No. 11, pp. 2399-2407; Nov. 2008.

K.F. Chang and K. K. Cheng; "A 2.4 GHz Quadrature-Input Programmable Fractional Frequency Divider"; IEEE Microwave and Wireless Components Letters; vol. 21, No. 1; Jan. 2011.

L. Xiu; "Nanometer Frequency Synthesis Beyond the Phase-Locked Loop"; John Wiley IEEE-Press, ISBN: 978-1-118-16263-7; Aug. 2012.

(Continued)

*Primary Examiner* — Tuan T Lam

(74) *Attorney, Agent, or Firm* — Andrew D. Fortney; Central California IP Group, P.C.

(57) ABSTRACT

An open loop clock divider circuit includes (a) a first divider configured to receive an incoming clock signal and output a first divided clock signal, (b) a flying-adder synthesizer configured to fractionally divide the first divided clock signal and output a fractionally divided clock signal, and (c) a second divider configured to receive the fractionally divided clock signal and output a second divided clock signal. The open loop clock divider circuit advantageously provides a fractional divider in which there is no feedback loop between the source frequency ($f_s$) and the destination frequency ($f_d$). Methods of generating a divided clock signal involving the open loop clock divider circuit are also disclosed.

18 Claims, 21 Drawing Sheets

(56) References Cited

OTHER PUBLICATIONS

L. Xiu and Z. You; "A "Flying-Adder" Architecture of Frequency and Phase Synthesis with Scalability"; IEEE Trans. on VLSI; vol. 10, No. 10, pp. 637-649; Oct. 2002.

Liming Xiu; "Circuits and Methods for Time-Average Frequency Based Clock Data Recovery"; U.S. Appl. No. 13/630,988; filed Sep. 28, 2012.

Liming Xiu; "Circuits and Methods for Clock Generation Using a Flying-Adder Divider Inside and Optionally Outside a Phase Locked Loop"; U.S. Appl. No. 13/677,170; filed Nov. 14, 2012.

* cited by examiner

FIG. 9

| Ch # | $f_s$ MHz | $f_n$ MHz | Flying-Adder control word $F = I + r$ | $f_a$ MHz | $f_d$ MHz |
|---|---|---|---|---|---|
| 11 | 2405 | 300.625 | 18 + 101/128 | 256 | 2 |
| 12 | 2410 | 301.25 | 18 + 106/128 | 256 | 2 |
| 13 | 2415 | 301.875 | 18 + 111/128 | 256 | 2 |
| 14 | 2420 | 302.5 | 18 + 116/128 | 256 | 2 |
| 15 | 2425 | 303.125 | 18 + 121/128 | 256 | 2 |
| 16 | 2430 | 303.75 | 18 + 126/128 | 256 | 2 |
| 17 | 2435 | 304.375 | 19 + 3/128 | 256 | 2 |
| 18 | 2440 | 305 | 19 + 8/128 | 256 | 2 |
| 19 | 2445 | 305.625 | 19 + 13/128 | 256 | 2 |
| 20 | 2450 | 306.25 | 19 + 18/128 | 256 | 2 |
| 21 | 2455 | 306.875 | 19 + 23/128 | 256 | 2 |
| 22 | 2460 | 307.5 | 19 + 28/128 | 256 | 2 |
| 23 | 2465 | 308.125 | 19 + 33/128 | 256 | 2 |
| 24 | 2470 | 308.75 | 19 + 38/128 | 256 | 2 |
| 25 | 2475 | 309.375 | 19 + 43/128 | 256 | 2 |
| 26 | 2480 | 310 | 19 + 48/128 | 256 | 2 |

CIRCUITS AND METHODS FOR USING A FLYING-ADDER SYNTHESIZER AS A FRACTIONAL FREQUENCY DIVIDER

FIELD OF THE INVENTION

The present invention generally relates to the field of clock generation. More specifically, embodiments of the present invention pertain to circuitry and methods for clock generation using an open loop fractional frequency division architecture based on a flying-adder divider or period synthesizer.

DISCUSSION OF THE BACKGROUND

Generally, a clock signal is an important signal in electronic systems, and a frequency is an important characteristic of a clock signal. In modern VLSI systems, various functional blocks operate at their own clock rates. In most cases, these different clock rates are related to each other through a fixed ratio. As a result, frequency division is a critical issue in electronic system designs.

In electronic system designs, it is often required to divide the frequency of a high frequency signal (e.g., a source frequency) to a low frequency signal (e.g., a destination frequency). Typically, integer frequency division can be easily realized. If the divide ratio is an integer, a conventional frequency divider may be used, in which the divide ratio is expressed by the following equation:

$$f_{out} = f_{in}/N \quad (1)$$

where N is an integer.

However, if the divide ratio is a non-integer (e.g., a fraction), the conventional frequency divider cannot achieve the desired result. For example, if a source frequency is 2475 MHz (e.g., a RF carrier) and a destination frequency is 2 MHz (e.g., a baseband clock signal), thus the ratio between the two (e.g., 2475/2) is equal to 1237.5, which is a non-integer. Fractional frequency division is a nontrivial task, and is traditionally achieved through a phase locked loop (PLL).

FIG. 1 shows a diagram of a conventional integer-N PLL 100 using a feedback mechanism. Conventionally, the integer-N PLL 100 is used to achieve the fractional frequency division, in which:

$$f_d = (N/[P*M])*f_s \quad (2)$$

where $f_s$ and $f_d$ are the source and destination frequencies, respectively, where $f_s$ is the source frequency, $f_d$ is the destination frequency, P is the divide ratio of /P divider 110, N is the divide ratio of /N divider 160, and M is the divide ratio of /M divider 150. Typically, P, N and M are integers. Thus, the resulting division ratio ($f_s/f_d$) may be expressed by the following equation:

$$f_s/f_d = (P*M)/N \quad (3)$$

where (P*M)/N is a number that can be a fraction. Thus, the resulting division ratio $f_s/f_d$ may be expressed as in Equation (3) above, and accordingly, a fractional ratio may be obtained from (M*P)/N.

In FIG. 1, phase frequency detector 120 detects the frequency and/or phase difference between the input clock signal 115 and feedback signal 165, and outputs an offset signal 125 to a low pass filter 130. Subsequently, the filter 130 smoothes the offset signal 125, and outputs an adjustment signal 135 to a voltage controlled oscillator (VCO) 140. The VCO 140 outputs a periodic signal 145 to (i) a divide-by-M divider 150 and (ii) a divide-by-N divider 160, where M and N are integers and are constant. Divider 150 outputs a frequency-divided clock signal 155, and the divider 160 outputs a feedback signal 165 to the phase detector 110 for comparison with the clock signal 115.

FIG. 2 shows a diagram of a conventional fractional-N PLL 100' using a feedback loop. Using fractional-N PLL 100', a divide-by-N·r divider 162 is a number having a fractional portion, in which N is the integer part and r is the fractional part. More fractional division ratios are available using PLL 100', as expressed in the following equation:

$$f_s/f_d = (P*M)/(N·r) \quad (4)$$

Thus, the resulting division ratio of PLL 100' is expressed in Equation (4) above. In this configuration, the integer divider inside the loop can dynamically switch its division ratio. On average, the actual ratio achieved is N·r, where N is the integer part and r is the fractional part. Based on Equation (4) above, almost any fractional division ratio may be realized.

One of the issues with using a PLL is the cost in power and area. Additionally, unlike a counter, which directly divides the frequency down, the frequency ratio generated from a PLL contains a certain degree of error since it uses feedback. Feedback is an indirect, compare-then-correct approach. Thus, the feedback mechanism (e.g., the compare-then-correct mechanism) inevitably introduces some degree of frequency inaccuracy. Another technique popular in wireless applications is the use of an injection-locked fractional frequency divider.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

Embodiments of the present invention relate to circuitry and methods for generating a clock signal. The circuit generally comprises (a) a first frequency divider configured to (i) receive an incoming clock signal and (ii) output a first divided clock signal, (b) a flying-adder synthesizer configured to (i) fractionally divide the first divided clock signal, and (ii) output a fractionally divided clock signal, and (c) a second frequency divider configured to (i) receive the fractionally divided clock signal, and (ii) output a second divided clock signal. The first and second frequency dividers are typically integer dividers having the same or different divider ratio(s). The architectures and/or systems generally include a clock circuit embodying one or more of the inventive concepts disclosed herein. The method of generating a divided clock signal generally comprises (1) dividing an incoming clock signal; (2) fractionally dividing the divided incoming clock signal in accordance with a multi-bit frequency word; and (3) further dividing the fractionally divided clock signal. Generally, the divided incoming clock signal is fractionally divided using a flying adder divider receiving the multi-bit frequency word.

The present invention relates to a flying-adder based fractional divider, in which there is no feedback loop mechanism between the source frequency ($f_s$) and the destination frequency ($f_d$). Thus, the present invention advantageously provides (i) lower power, (ii) smaller dimensions, (iii) higher accuracy (e.g., no feedback loop induced frequency error), and (iv) reduced implementation complexity (e.g., a pure digital implementation may be possible in some cases).

In various embodiments of the present invention, the present open loop fractional frequency division system may have a first integer divider, a flying-adder divider, and a second integer divider, where the first divider generates multiple phases for the flying-adder divider, the flying-adder divider performs fractional division, and the second divider performs post-divider fractional recovery.

These and other advantages of the present invention will become readily apparent from the detailed description of various embodiments below.

BRIEF DESCRIPTION OF THE DRAWINGS

FIG. 9 is a table showing exemplary control parameter values for a number of channels in a Zigbee-type receiver in accordance with the present invention.

DETAILED DESCRIPTION

Figure 1:
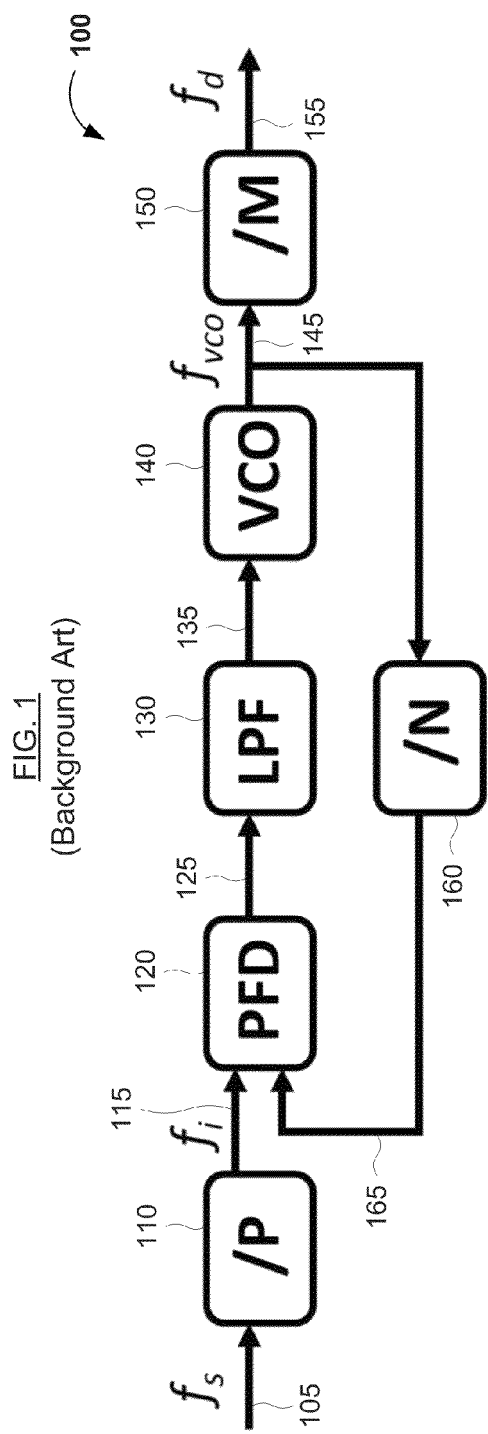
FIG. 1 is a diagram of a conventional integer-N PLL having a feedback mechanism.
Figure 2:
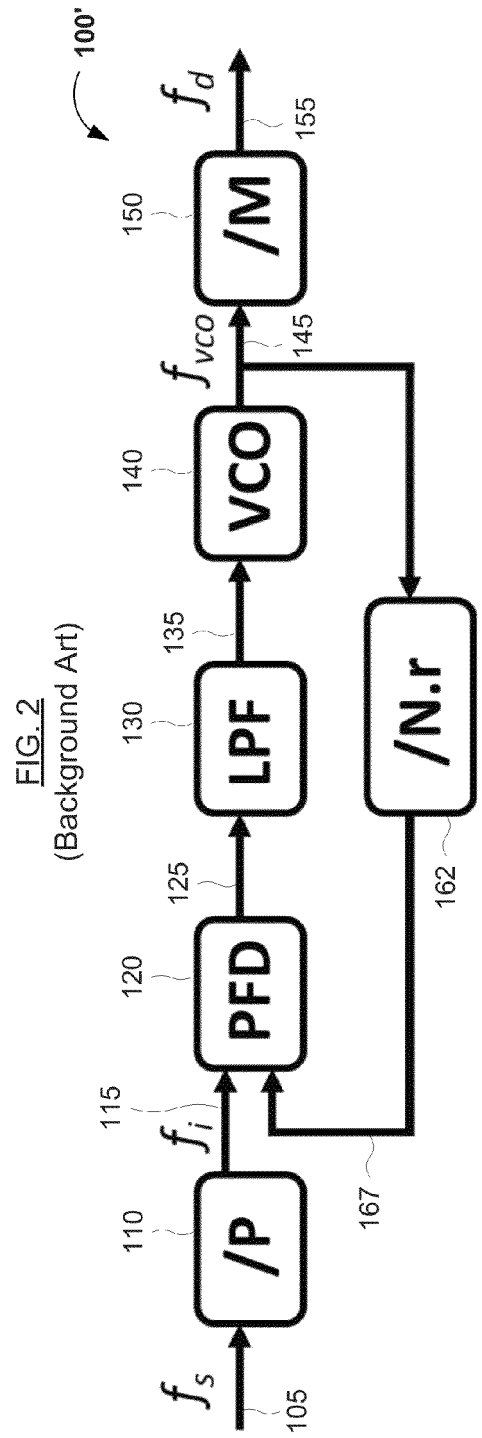
FIG. 2 is a diagram showing a conventional fractional-N phase locked loop having a feedback mechanism.

Reference will now be made in detail to various embodiments of the invention, examples of which are illustrated in the accompanying drawings. While the invention will be described in conjunction with the following embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions that follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer or signal processing system, or similar processing device (e.g., an electrical, optical, or quantum computing or processing device), that manipulates and transforms data represented as physical (e.g., electronic) quantities. The terms refer to actions and processes of the processing devices that manipulate or transform physical quantities within the component(s) of a system or architecture (e.g., registers, memories, flip-flops, other such information storage, transmission or display devices, etc.) into other data similarly represented as physical quantities within other components of the same or a different system or architecture.

Furthermore, for the sake of convenience and simplicity, the terms "clock," "time," "rate," "period," "frequency" and grammatical variations thereof are generally used interchangeably herein, but are generally given their art-recognized meanings. Also, for convenience and simplicity, the terms "data," "data stream," "waveform" and "information" may be used interchangeably, as may the terms "connected to," "coupled with," "coupled to," and "in communication with" (each of which may refer to direct or indirect connections, couplings, and communications), but these terms are also generally given their art-recognized meanings.

Exemplary Clock Generation Circuit

In one aspect, the present invention concerns an open loop clock divider circuit that generally comprises (a) a first frequency divider configured to (i) receive an incoming clock signal and (ii) output a first divided clock signal, (b) a flying-adder synthesizer configured to (i) fractionally divide the first divided clock signal, and (ii) output a fractionally divided clock signal, and (c) a second output frequency divider configured to (i) receive the fractionally divided clock signal, and (ii) output a second divided clock signal.

Figure 3A:
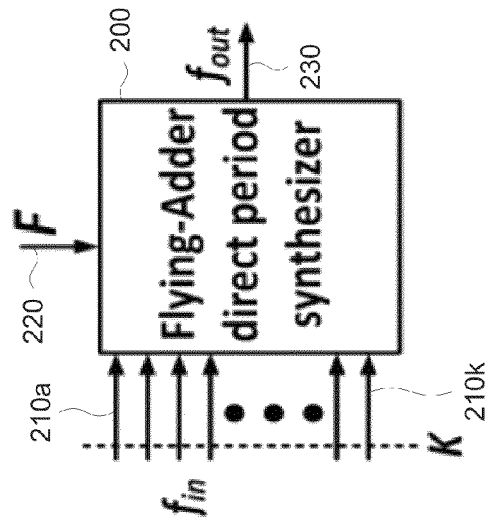
FIG. 3A is a diagram showing a flying-adder direct period synthesizer as a fractional divider according to the present invention.
Figure 3B:
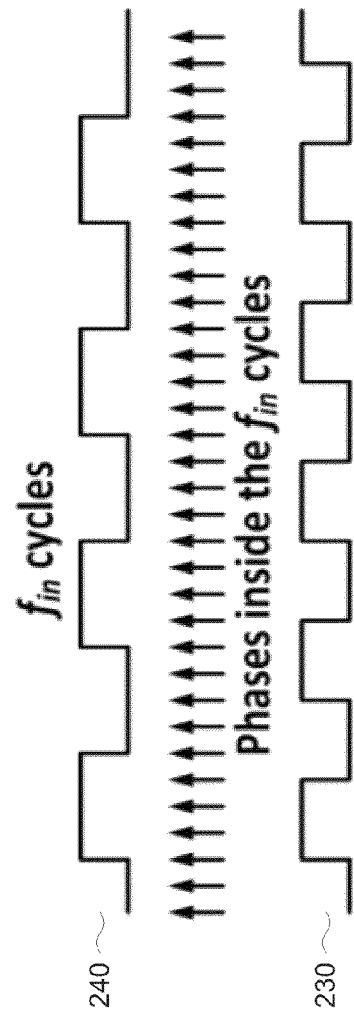
FIG. 3B is a diagram showing exemplary frequency relationships between input and output signals.

Referring to FIG. 3A, a flying adder synthesizer 200 is used as a fractional divider. The flying-adder direct period synthesizer 200 can function as a phase divider because it can select phases 210a-210k inside the input signal's cycle, thus enabling functionality as a fractional divider. For the fractional divider of FIG. 3A, the frequency relationship between input and output signals 230 and 240 is expressed in the following equation:

$$f_{out} = (K/F)(f_{in}) \quad (5)$$

where $f_{out}$ is the frequency of output clock 230, K is an integer representing the number of phases of the input clock signal 210, F is a fractional divider ratio defined by the multi-bit frequency word 220, and $f_{in}$ is the frequency of input clock 210 (shown as signal 240 in FIG. 3B).

Figure 4:
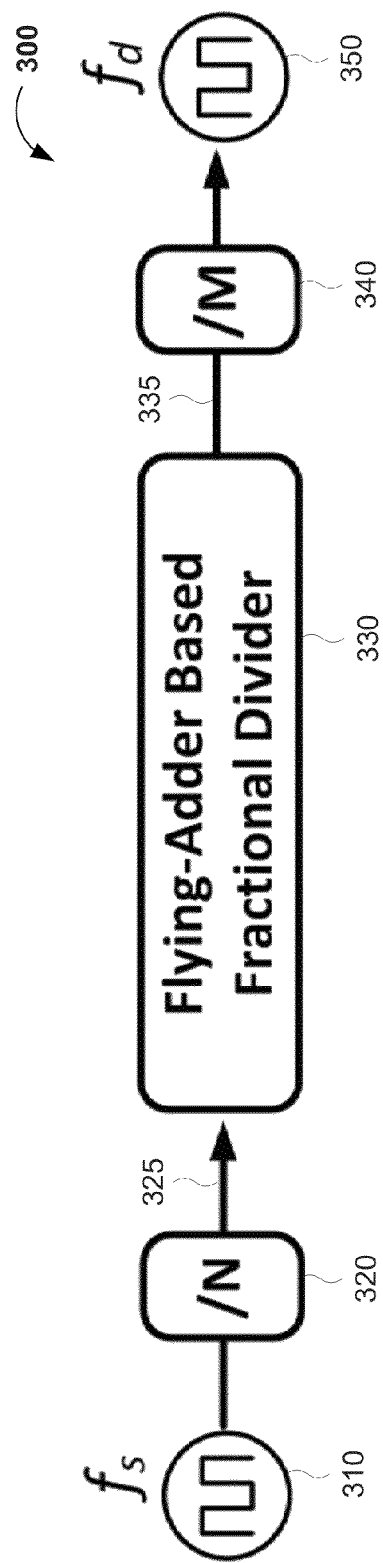
FIG. 4 is a diagram showing an exemplary flying-adder based fractional frequency division circuit according to the present invention.

Referring to FIG. 4, a flying-adder based system 300 is used to perform fractional frequency division without using a PLL or injection locking circuitry. Fractional divider 300 comprises a first, divide-by-N divider 320 receiving an input periodic signal 310 and outputting a divided periodic signal 325, a flying-adder based fractional divider 330, and a second, divide-by-M divider 340 receiving the fractionally divided periodic signal 335 and outputting a divided destination clock signal 350. The flying-adder synthesizer 330 may be viewed as a fractional divider, and may be used to build an open-loop fractional frequency divider 300. No feedback mechanism is used, thereby providing a direct dividing approach using less power and a smaller area for the fractional divider circuit.

The division ratio of the present divider may be expressed by the following equations:

$$f_d = (K/[F*N*M])f_s \quad (6)$$

$$f_s/f_d = F*N*M/K \quad (7)$$

Figure 5:
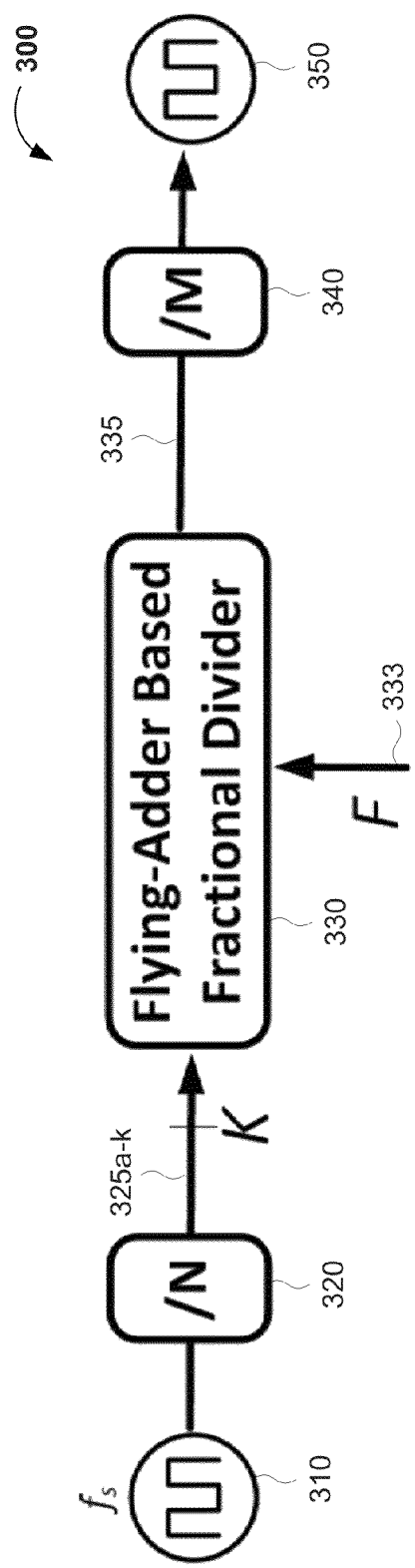
FIG. 5 is a diagram showing the exemplary flying-adder based system of FIG. 4 receiving a control word in accordance with the present invention.

FIG. 5 shows flying-adder fractional division system 300 in more detail. There are three dividers in series between input clock 310 having a source frequency ($f_s$) and output clock 350 having a destination frequency ($f_d$) that is a fractionally divided value of the source frequency. With the help of Equation (5) above, the division ratio is obtained in Equation (7) above. F is the control word 333 for the flying-adder divider 330, and K is the number of output phases 325a-k provided from the divide-by-N divider 320.

The frequency of output signal 325a-k from the divide-by-N divider 320 has a value in accordance with the following equation:

$$f_n = f_s/N \quad (8)$$

The frequency of output signal 335 from the flying-adder based fractional divider 330 has a value in accordance with the following equation:

$$f_a = K/F(f_n) = (K/[F*N]) \quad (9)$$

The destination frequency 350 following the divide-by-M divider 350 has a value in accordance with the following equation:

$$f_d = f_a/M = (K/[F*N*M])*f_s \quad (10)$$

N is the divider ratio of an integer frequency divider, and generally has a value that is a power of two. For example, N may be 2, 4, 8, 16, etc. The divide-by-N divider 320 divides the input clock frequency down by N times and generates multiple phases at its output. The signal 310 at the source frequency may be available in various formats. For an example of a source frequency with two inputs and a /N divider where N=2, the in-phase)(0° and the out-of-phase) (180°) signals are available (see, e.g., input clock signals 550a and 550b in FIG. 11). As a result, four phases are generated at the output, since N equals 2. Alternatively, when four phases are available at the input 310, sixteen phases can be obtained at the output 325 if N equals 4 (see, e.g., FIG. 17). In general, the relationship between K and N can be expressed in the following equation:

$$K = p*N \quad (11)$$

where p is the number of phases available at the source frequency.

Figure 6:
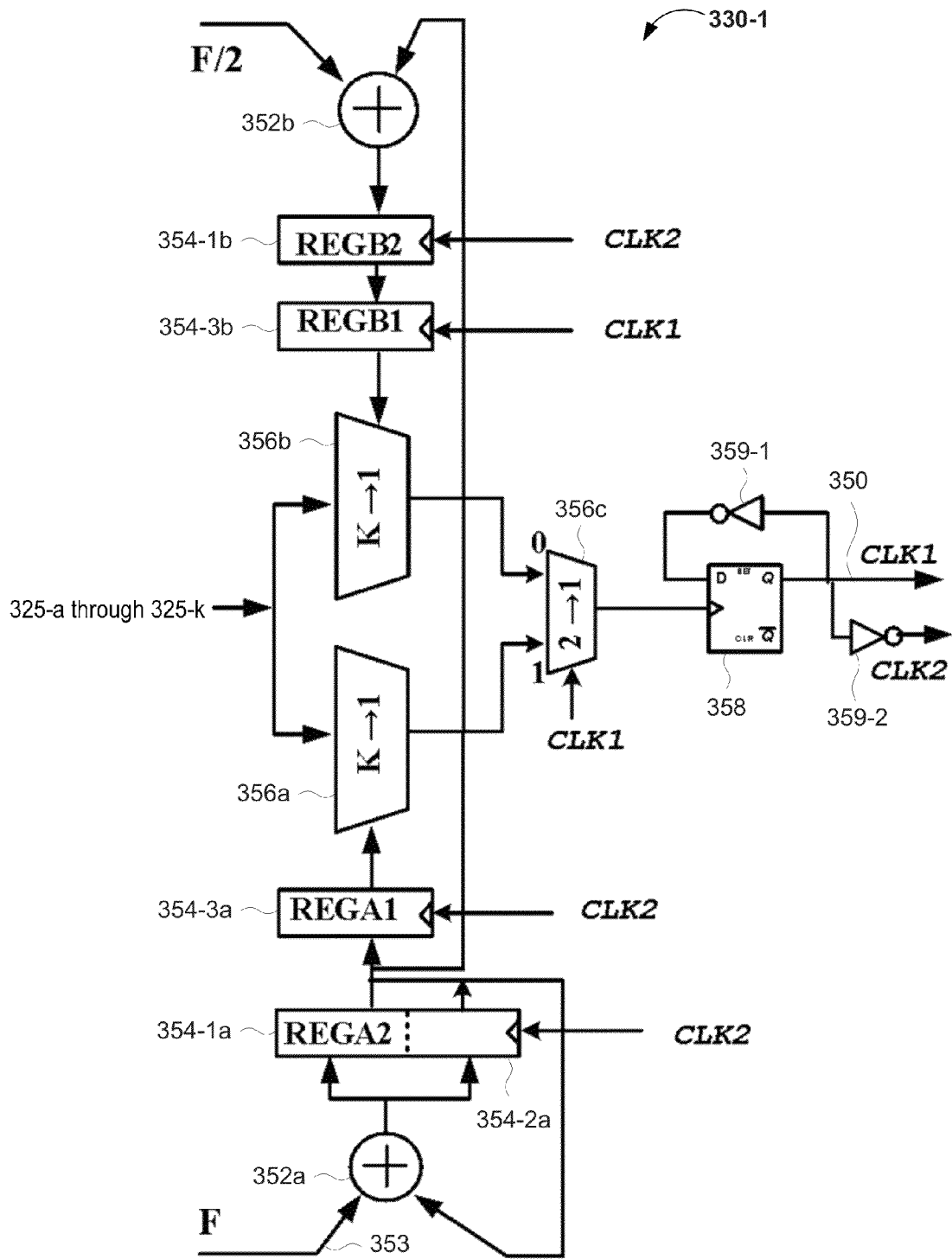
FIG. 6 is a diagram showing an exemplary flying-adder circuit suitable for the present invention.

FIG. 6 is a diagram showing an exemplary flying-adder 330-1, suitable for clock generation or division according to the present invention. The K clock phases 325-a through 325-k from the divide-by-N divider 320 of FIG. 5 are fed into the flying-adder divider 330-1. The K inputs 325-a through 325-k applied to the inputs of multiplexers 356a, 356b are a group of signals representing input phases to the flying-adder divider 330-1. The K inputs 325-a through 325-k are essentially reference signals for the flying-adder divider 330-1. Multiplexers 356a and 356b are K-to-1 multiplexers for selecting one of the K phases 325-1 through 325-K according to the digital value applied by registers 354-3a and 354-3b, respectively. The outputs of multiplexers 356a and 356b are connected to a two-to-one multiplexer 356c, which selects between the outputs of multiplexers 356a and 356b in response to clock signal CLK1 (see the Q output 350 of D-type flip-flop 358). The output 350 of D-type flip-flop 358 is also connected via inverter 359-1 to the data input of D-type flip-flop 358, which causes CLK 1 350 to toggle in periodic fashion. D-type flip-flop 358 delivers clock signal CLK 1 350 from its Q output and clock signal CLK 2 via inverter 359-2.

The phase selection by multiplexers 356a and 356b is effected by two adder legs. The first (lower) adder leg includes adder or accumulator 352a, which adds the value of the frequency control word F 353 (which in one embodiment may be 32 bits wide, and which may contain fractional bit values) to the value from registers 354-1a and 354-2a (which, when combined, may be 32 bits wide). The frequency control word F 353 generally determines or controls the output frequency, and may be provided by the user. Registers 354-1a (the integer register or part) and 354-2a (the fractional register or part) receive and store (e.g., on an edge such as the rising edge of the clock signal CLK2) the sum generated by adder 352a. The register 354-1a stores the integer part of the sum of frequency word F 353 and the output of registers 354-1a and 354-2a. Register 354-2a stores the fractional part 354-2 of this sum generated by the accumulator 352. The integer bits of register 354-1a are transferred to register 354-3a on an edge of CLK2. The value stored in register 354-3a is applied to the select input(s) of multiplexer 356a.

The second (upper) adder leg of the flying adder circuit includes adder 352b, which receives a digital signal F/2 at one input, and the contents of register 354-1a at a second input. Signal F/2 is, in one implementation, the frequency word F 353 divided by 2, to provide a 50% duty cycle at the output(s) of flying-adder 330-1. Adder 352b sums these two values, and stores the sum in register 354-1b on a (rising) edge of output clock signal CLK2. This value is clocked into register 354-3b on the next (rising) edge of output clock signal CLK1 350. The output of register 354-3b is then presented to the select input of multiplexer 356b.

Multiplexer 356c is controlled by output clock signal CLK1 350, so that the output of either multiplexer 356a or multiplexer 356b is forwarded to the clock input of flip-flop 358 in response to clock signal CLK1 having a first predetermined value (e.g., high or "1"), and the output of multiplexer 356b is forwarded in response to clock signal CLK1 having a second predetermined value (e.g., low or "0"). Clock signals CLK1, CLK2 are produced by flip-flop 358 as described above. Of course, it will be clear from the discussion herein that alternative and/or equivalent circuitry can provide the same or functionally similar results. CLK1 is the output signal 350 of the flying-adder 330-1. Referring back to FIG. 5, CLK1 350 goes to the divide-by-M divider 340, whose output is the destination frequency ($f_d$).

Using Equations (5) and (11) above, the ratio between the source frequency and the flying-adder output frequency $f_s/f_a$ may be expressed in the following equation:

$$f_s/f_a=(F*N)/K=F/p \quad (12)$$

where F is an integer of from 2 to 2K (or 2pN). If p equals 1 in Equation (12), the present flying-adder divider functions as a programmable integer frequency divider. If p equals 2, a fractional ratio of 0.5 may be reached. A fractional ratio of 0.25 is reachable when p equals 4, and so on.

When the integer frequency divider 340 of FIG. 5 receives the output of the flying-adder divider 330, the source to destination frequency ratio is express by the equation below:

$$f_s/f_d=N/K(F*M)=1/p(F*M) \quad (13)$$

In Equation (13) above, F is the flying-adder frequency control word 333 and may be expressed as F=I+r, where I is an integer and r is a fraction. When r does not equal 0, the flying-adder output is a Time-Average-Frequency output, having two types of cycles. However, when r has a value of 1/M, 2/M, 3/M, . . . or (M−1)/M, the fractional effect can be recovered by the divide-by-M post divider 340 using a technique called post-divider fractional-bit-recovery (PDFR). In other words, the output from the divide-by-M divider 340 contains only one type of cycle when the PDFR-compatible fractions are used in the frequency control word F 333. Since the PDFR technique may be used between the flying-adder divider 330 and the divide-by-M divider 340, control word F 333 may be a fraction, and I and i can be integers, as expressed in the following equation:

$$F=I+i/M \quad (14)$$

where i is an integer of at least one (e.g., 1, 2, etc.), up to M−1. In such cases, Equation (13) above may be expressed as follows:

$$f_s/f_d=1/p(F*M)=1/p(I*M+i) \quad (15)$$

where i is an integer of from 1 to M−1. Thus, the division ratio may be expressed by the following equation:

$$f_s/f_d=N/K(M*I+i) \quad (16)$$

In real circuit implementations, the source signal may be available in various formats. If the source signal $f_s$ has only one output, then K equals N, and the division ratio may be expressed as follows:

$$f_s/f_d=M*I+i \quad (17)$$

If the source signal $f_s$ has two outputs (e.g., the clock signal and its inversion or complement, 0° and 180°), then K=2*N, and the division ratio may be expressed as follows:

$$f_s/f_d=½(M*I+i) \quad (18)$$

If the source signal $f_s$ has four outputs (e.g., I, Q and the inversions or complements thereof, at 0°, 90°, 180° and 270°), then K=4*N, and the division ratio may be expressed as follows:

$$f_s/f_d=¼(M*I+i) \quad (19)$$

When $f_s/f_d$=M*I+i, the flying-adder divider is a programmable frequency divider since i is an integer from 1 to M−1. Thus, the divide ratio is programmable. In addition, in this case, the divide ratio is an integer (since M, I and i are all integers). However, when $f_s/f_d$=½(M*I+i), the fractional ratio of 0.5 is available, and when $f_s/f_d$=¼(M*I+i), the fractional ratio of 0.25 is available. Furthermore, when a Time-Average-Frequency clock signal is used in the final divider output, any fractional ratio ($f_s/f_d$) may be achieved. In this case, the frequency control word F may be a non-PDFR compatible fraction.

Thus, the architectural features of the present flying-adder divider include:
  A divide-by-N divider that generates multiple phases;
  A flying-adder circuit that performs fractional frequency division;
  A divide-by-M divider that recovers any fractional effect created by the flying-adder divider;
  The number of available phases (p) from the source signal determines the achievable fractional ratio (e.g., l/p);
  For a desired $f_s/f_d$ ratio (i.e., equal to the [F*N*M]/K ratio), the values of N, F and M are flexible as long as (F*N*M)/K is fixed, providing flexibility in implementing the flying-adder divider; and
  If non-PDFR-compatible fractions are used in the frequency control word F, other fractional division ratios may be achieved, in which case the resulting signal is a Time-Average-Frequency signal.

Figure 7:
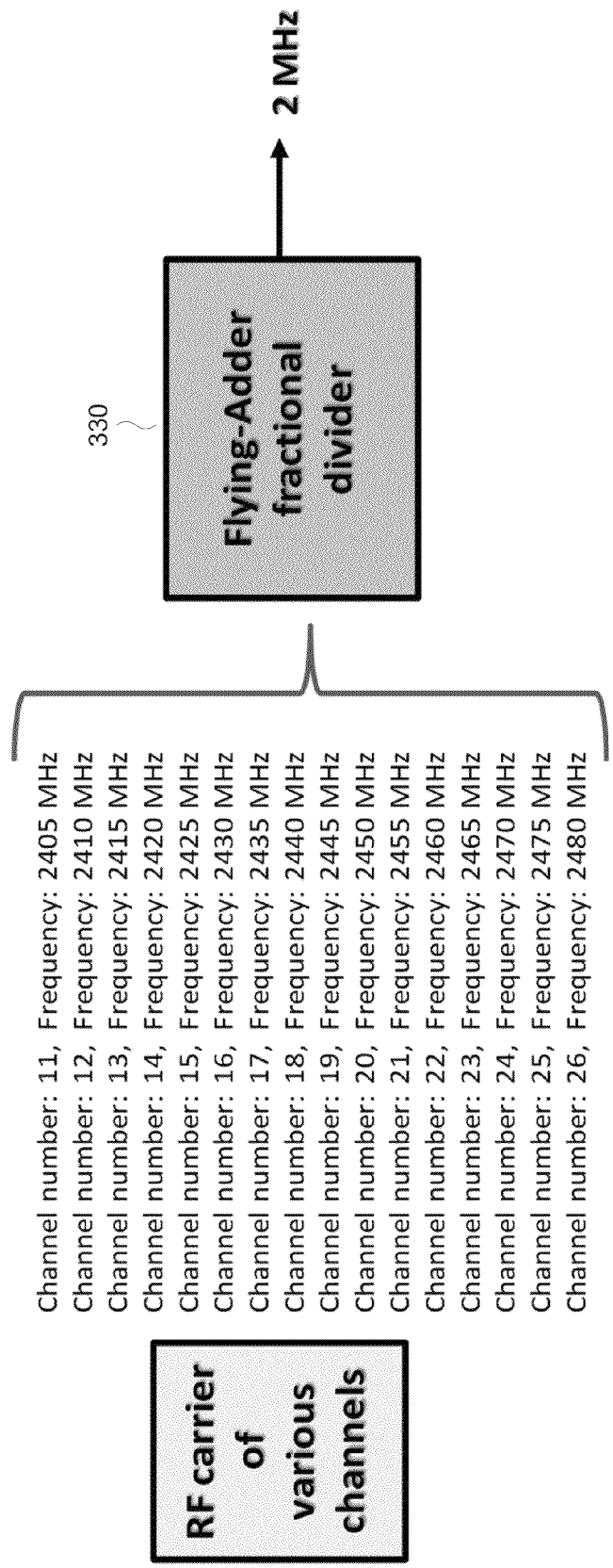
FIG. 7 is a diagram showing a ZigBee receiver having sixteen channels of different frequencies for which the present invention may be useful.

FIG. 7 lists carrier frequencies for 16 ZigBee channels in the 2.4 GHz ISM Band at which a wireless personal area network (WPAN) baseband transceiver may operate in accordance with the present invention. The frequencies may be defined by the following equation:

$$f_c=2405+5*(C-11)\text{MHz} \quad (20)$$

where C is an integer of from 11 to 26. Of course, there are many equivalent ways to define these channel frequencies. Also, while the example given spaces channels apart by 5 MHz, any other inter-channel spacing may be employed. Each carrier frequency in the example of FIG. 7, regardless of the channel, is used to generate a 2 MHz output (e.g., the baseband clock).

ZigBee is a wireless personal area network (WPAN) standard built on the physical (PHY) layer and media access control (MAC) layer defined in IEEE 802.15.4. Its key characteristics include low cost and low power. In this exemplary design, a 2.4 GHz ISM band wireless sensor system has a 250 Kb/s data rate. The RF carrier of the transmitter is generated from a temperature-compensated open looped LC oscillator (e.g., not locked to a particular reference through a PLL), oscillating at approximately 2.4 GHz. The baseband clock at 2 MHz (e.g., a chip rate of 8 times of 250 Kb/s) is derived from the RF carrier using the present flying-adder divider, since there is no crystal in the system.

From each of the sixteen RF frequencies in FIG. 7, a 2 MHz baseband clock frequency is required to be generated. The ratios between half of the frequencies and 2 MHz have a fraction of 0.5. To avoid the use of a PLL, the present flying-adder divider 330 performs fractional division. Advantageously, the present flying-adder based divider reduces power, consumes less chip real estate, and provides a more accurate destination frequency by avoiding the use of feedback (such as in a PLL).

Figure 8:
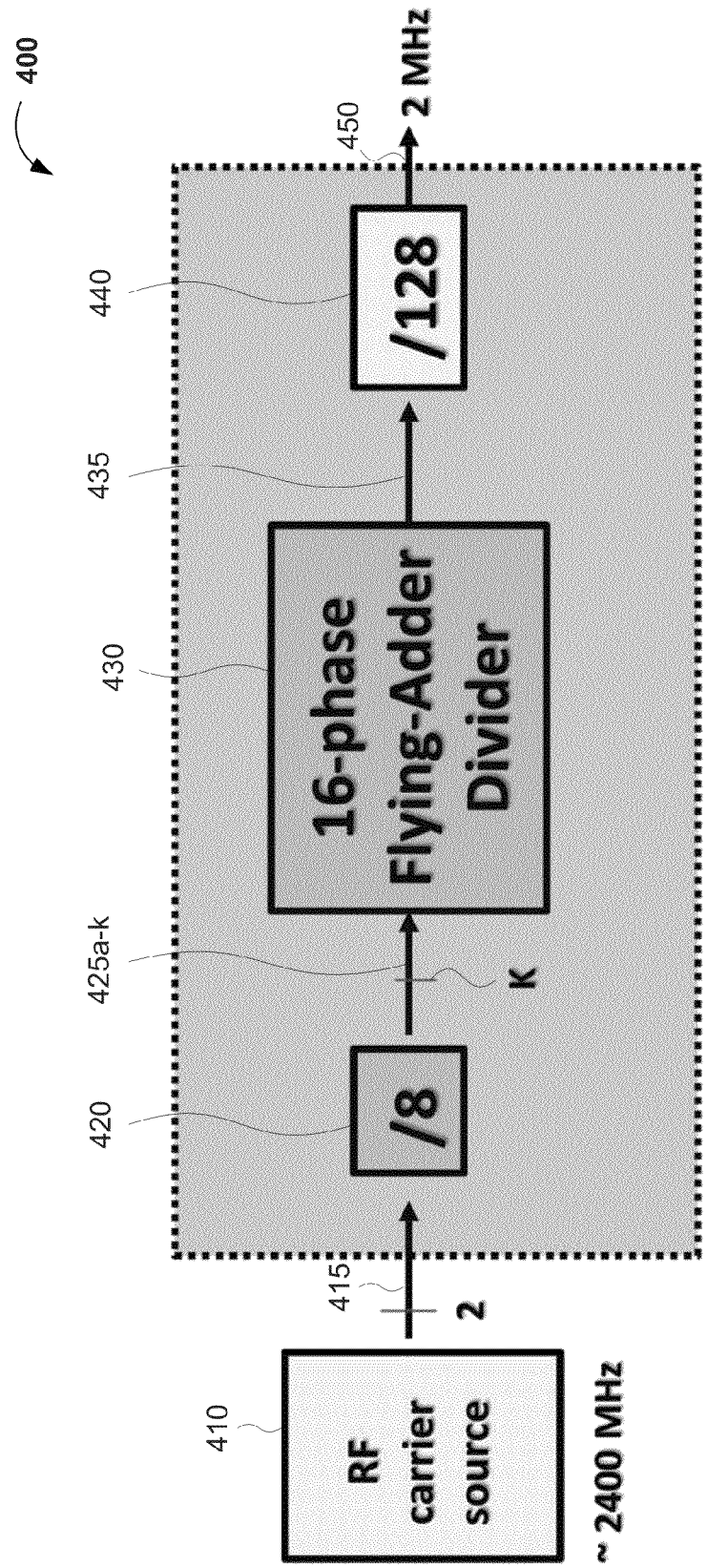
FIG. 8 is a diagram showing another exemplary flying-adder divider circuit in accordance with the present invention.

FIG. 8 shows a general design of a flying-adder based fractional divider system 400 for implementing the function (s) and/or objective(s) in FIG. 7. The RF carrier 415 from RF carrier source 410 has two outputs at phases of 0° and 180° (p=2). From these signals 415, an N=8 divider 420 produces sixteen outputs 425 (K=16) for the following flying-adder divider 430. For each channel frequency, the control word (not shown) of the flying-adder divider 430 is chosen in such a way that its output is at 256 MHz. However, the output signal 435 may be a Time-Average-Frequency signal (e.g., having two types of cycles, $T_A$ and $T_B$) in accordance with one or more control word settings. The fractions used in the frequency control word are all multiples of $1/128$. The M=128 divider 440 subsequently recovers the fractional effect of flying-adder divider 430 and generates the final 2 MHz baseband clock signal 450 having only one type of cycle (500 ns).

FIG. 9 shows a table of control parameters for the ZigBee transceiver channels listed in FIG. 7. The first column to the right of the channel number is the channel frequency (e.g., source frequency), the second column is the frequency after the N=8 divider 420 (FIG. 8), the third column is the value of the frequency control word, the fourth column is the frequency after the flying-adder divider 430, and the fifth column is the baseband clock frequency (e.g., destination frequency) after the M=128 divider 440. Using channel 11, for example, the flying-adder divider control word for this case is 18+101/128. As a result, its output signal of 256 MHz comprises two types of cycles, $T_A=18\Delta$ and $T_B=19\Delta$ ($\Delta=Ts/p=0.5/f_s=207.9$ ps). For every 128 cycles, there are 27 $T_A$ cycles and 101 $T_B$ cycles. After the M=128 divider 440, the final output 450 includes only one type of cycle, 240$5\Delta$=500 ns (2 MHz).

Figure 10:
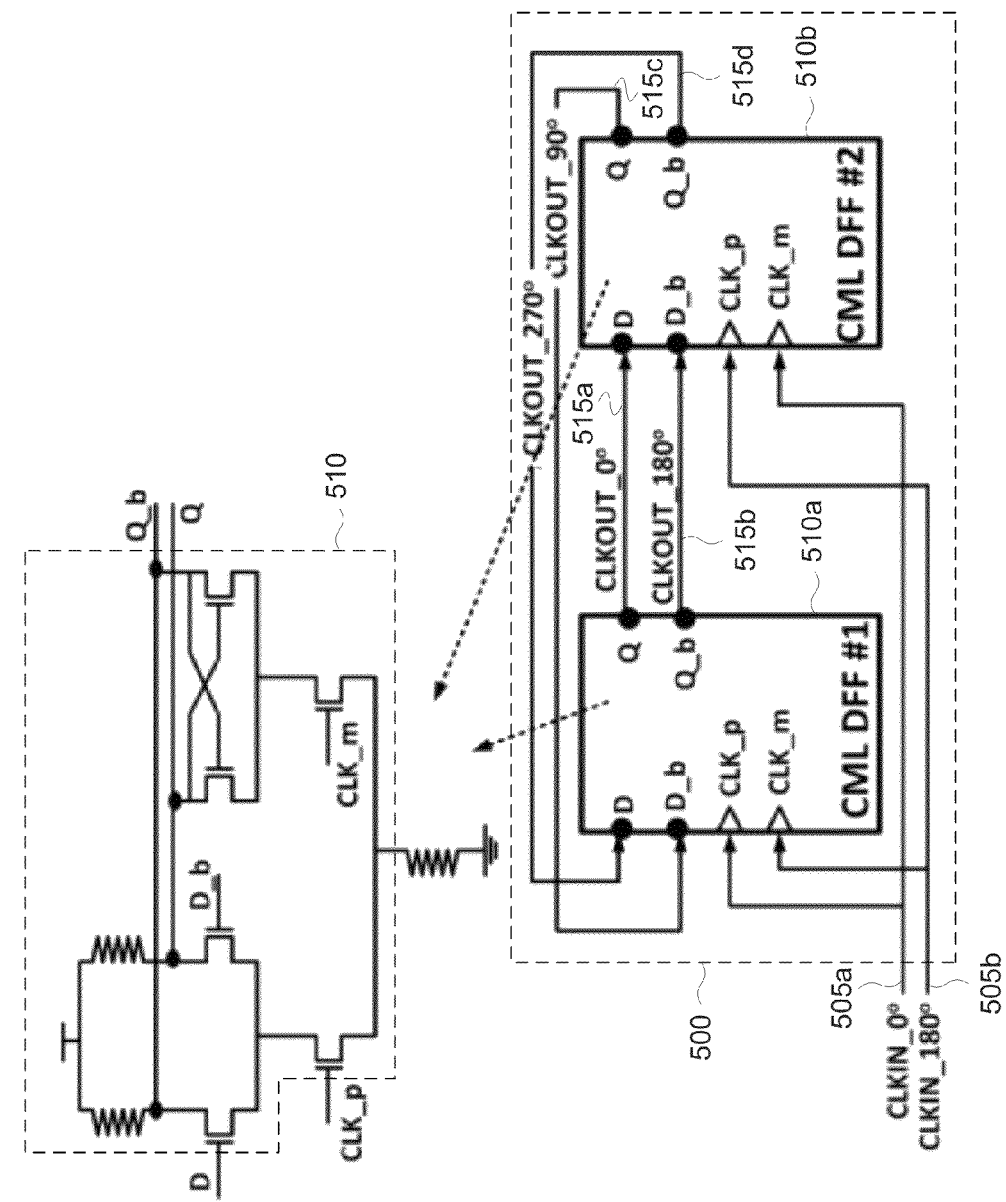
FIG. 10 is a diagram showing an exemplary $N_1=2$ divider suitable for use in the present invention.

FIG. 10 shows an example of a first divide-by-N divider 500 in which N=2 for generating four output phases from the input clock signals 505a-b. In the example of FIG. 10, current mode logic differential flip-flops (CML DFFs) 510a-b are used to construct the divide-by-N divider 500, since the RF carrier has a high frequency (e.g., approximately 2.4 GHz). The N=2 divider 500 may be formed by two DFFs 510a-b, as shown in the bottom portion of FIG. 10. When the input frequency of input clock signals 505a-b is 2.475 GHz (e.g., the two top traces 550a, 550b in FIG. 11), this divider 500 produces four outputs 515a-d at 1.2375 GHz (e.g., the four bottom traces 560, 562, 564, and 566 in FIG. 11), each having a phase separated by 90° from its neighbors.

Figure 12:
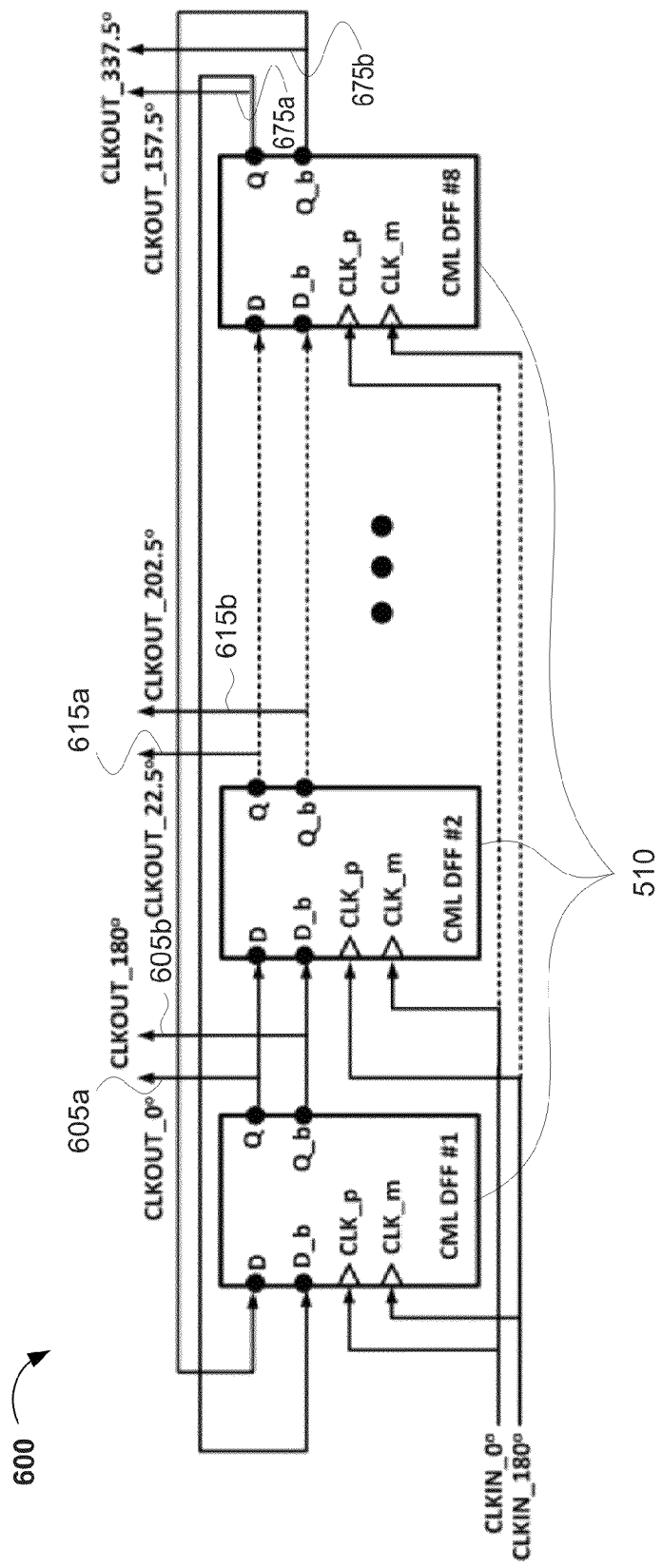
FIG. 12 is a diagram showing an exemplary N=8 divider formed by eight current mode logic differential flip-flops (CML DFFs) outputting 16 different, equally-spaced clock phases suitable for use in the present invention.
Figure 13:
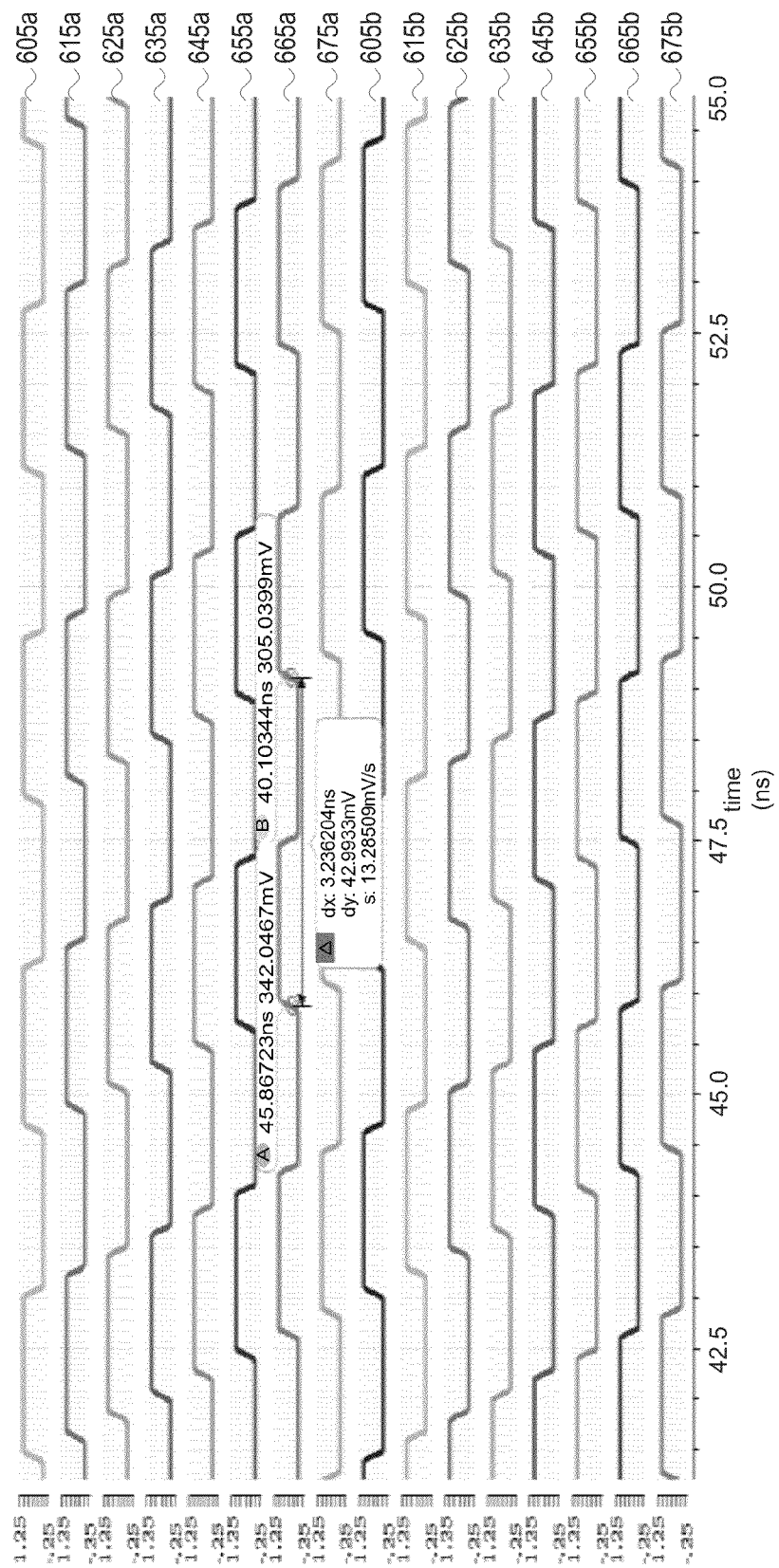
FIG. 13 is a diagram showing outputs from the exemplary N=8 CML-DFF divider of FIG. 12.

Referring to FIG. 12, the same CML DFF 510 (FIG. 10) may be used to form N=4 or N=8 dividers for generating 8 or 16 outputs. The schematic for an N=8 divider 600 is shown in FIG. 12. The sixteen output waveforms 605a-675b are shown in FIG. 13. To lower the power usage further, other options may be available as described herein.

Figure 11:
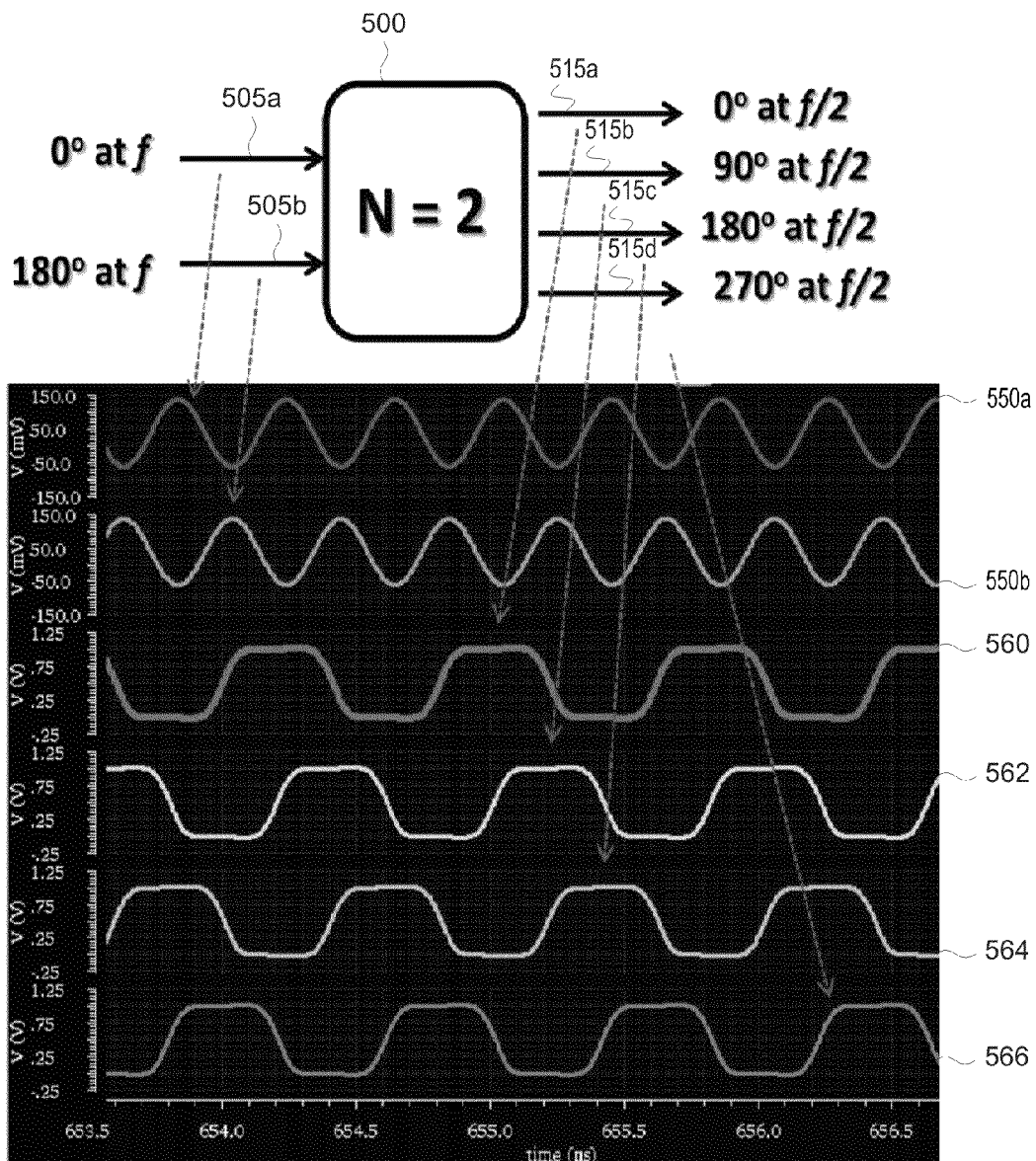
FIG. 11 is a diagram showing an exemplary generation of multiple phases of a divided clock signal from the N=2 divider of FIG. 10.
Figure 14:
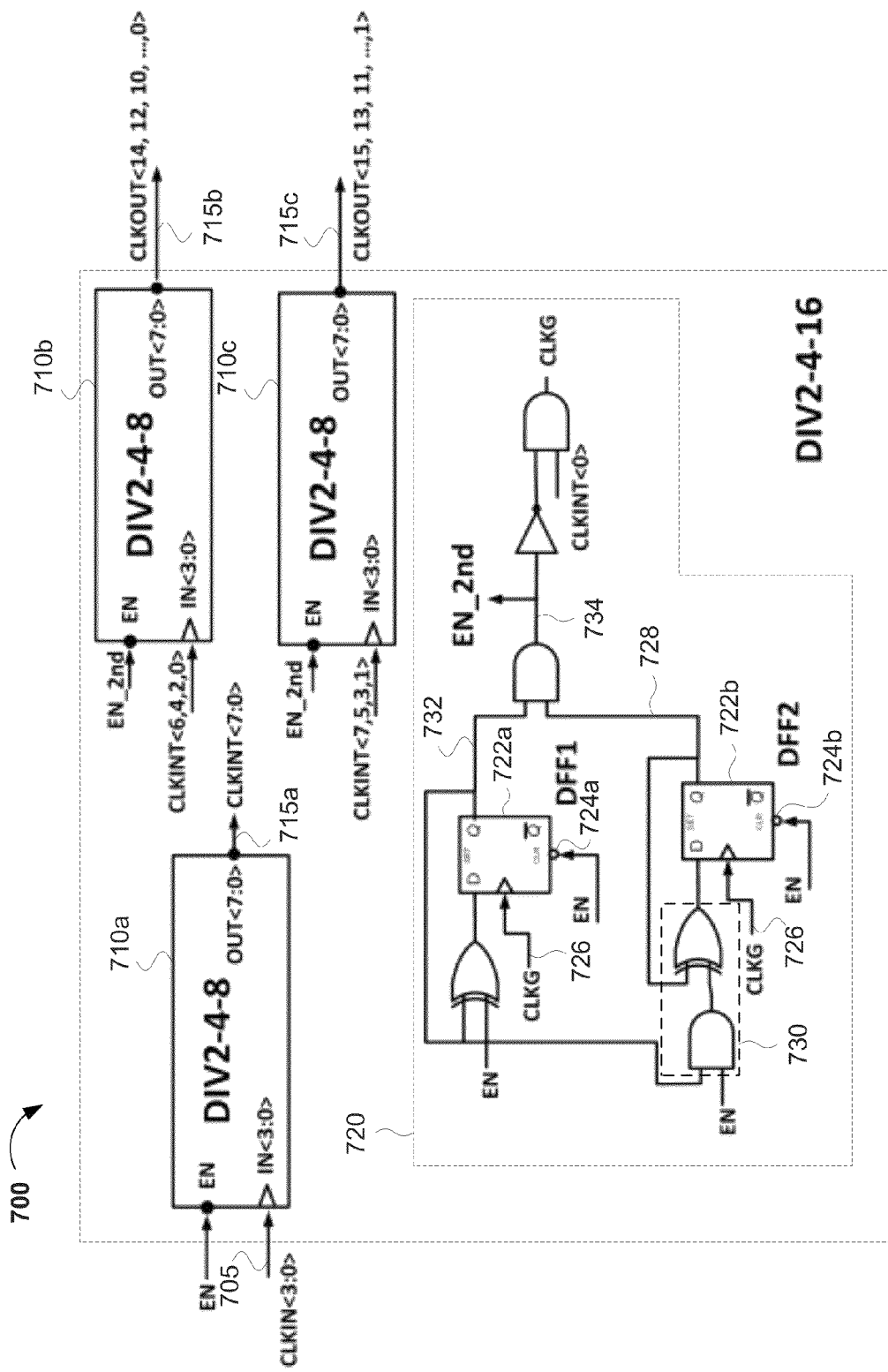
FIG. 14 is a diagram showing an exemplary $N_2$ divider (DIV2-4-16), suitable for use in the present invention.

Referring to FIG. 14, a second divide-by-N divider in which $N_2$=4 can also generate sixteen output phases using the outputs of divider 500 in FIG. 10 (the signals 560, 562, 564 and 566 in FIG. 11). Since the output of the $N_1$=2 divider (divider 500 in FIG. 10) is approximately 1.2 GHz, it is in the reachable speed range of standard cells in a conventional 65 nm manufacturing process. Therefore, a divide-by-N=4 standard cell-based divider 700 can generate 16 outputs (see FIG. 14). Such $N_1$ and $N_2$ dividers may be cascaded together to form the N=$N_1$*$N_2$=8 divider 420 in FIG. 8.

Figure 15:
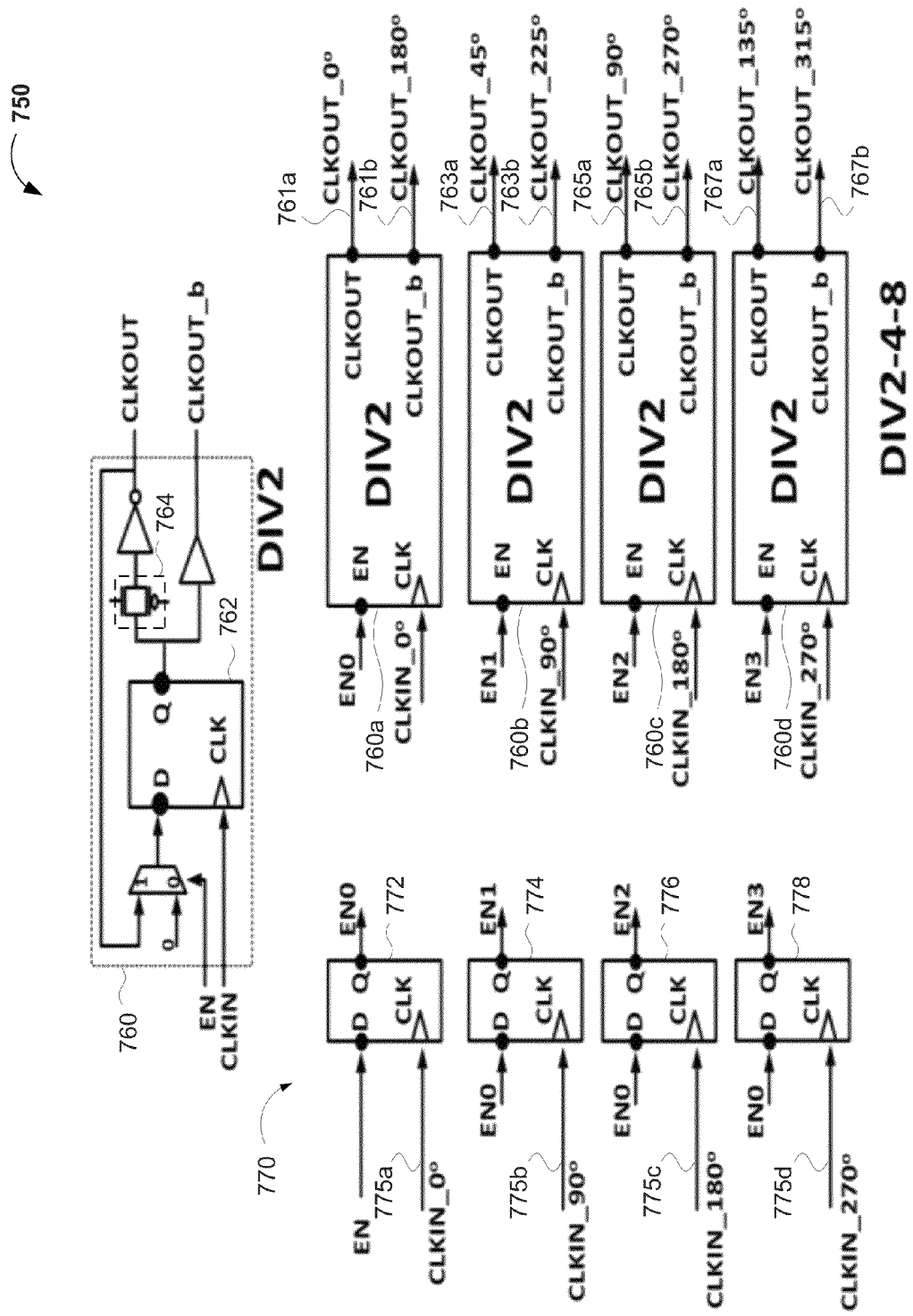
FIG. 15 is a diagram showing a lower level divider (DIV2-4-8) suitable for use in the DIV2-4-16 divider of FIG. 14.

The $N_2$=4 divider 700 of FIG. 14 is formed by two stages of divide-by-2 dividers. The first stage includes one block 710a. The second stage includes two blocks 710b and 710c. All the three blocks 710a-c use the same circuitry 750 that is shown in FIG. 15. Generally, the D-type flip-flop 762 is provided by the standard cell library. The transmission gate 764 is used to balance the delays of CLKOUT and CLKOUT b. Four DIV2 dividers 760a-d can create eight outputs 761a-b, 763a-b, 765a-b and 767a-b having an equal phase separation of 45° from four inputs 775a-d having a phase separation of 90° (and which may be the same as CLKIN<3:0>705 in FIG. 14). The challenging issue in this block is to synchronize the eight outputs 761a-b, 763a-b, 765a-b and 767a-b.

Typically, there are two potential problems: (i) the eight outputs 761a-b, 763a-b, 765a-b and 767a-b may have different states after each power up, and (ii) the phase relationship between the outputs 705a-735b may be fixed, but unknown. The key to solving the first problem is to set the initial conditions of the four DFFs that are inside 760a-d to a known state, such as "0". For this reason, an enable pin (EN) is included in each DIV2 divider 760a-d of FIG. 15. The four enable signal EN0-3 are activated at appropriate times using the four DFFs 772, 774, 776, and 778.

The input enable signal EN may be latched by the four input clock signals 775a-d. As shown in FIG. 15, the enable signal EN is first latched by a first flip-flop 772, then the output EN0 of the first flip-flop 772 is subsequently latched by the second through fourth flip-flops 774-778. As a result, the four resulting enable signals, EN0, EN1, EN2 and EN3, become active sequentially, with EN0 being active first, and are then fed to the corresponding blocks 760a-d.

The $N_2$ divider circuitry 700 (FIG. 14) comprises the DIV2-4-8 block 750 of FIG. 15. Three DIV2-4-8 blocks 710a-c are cascaded in two stages, as shown in FIG. 14. As previously discussed, the key challenge is the requirement that all the sixteen outputs 715b-c have to be generated in the correct order after each power up, which is more difficult than that of the DIV2-4-8 divider 750. The key point is that the enable signal (EN_2nd) for the second stage DIV2-4-8 divider blocks 710b-c can become active only after the first stage output 715a (CLKINT<7:0>) is valid. This is accomplished by the circuit 720 shown in the bottom drawing of FIG. 14. The EN_2nd is always '0' when EN is '0' due to the "clear" or reset pins 724a-b of DFF's 722a-b. After EN becomes '1', the DFFs are released. When the first bit of the output 715a of DIV2-4-8 divider block 710a is valid (CLKINT<0>), the CLKG signal 726 becomes active, triggering the two DFFs 722a-b. The output 728 of DFF 722b is delayed by one cycle due to the AND gate used in front. After the first occurrence of both outputs 728 and 732 of DFF 722a-b being '1', the EN_2nd becomes '1', and the two DIV2-4-8 blocks 710b-c at the second stage start to work. At the same time, it immediately disables the CLKG signal 726.

Figure 16:
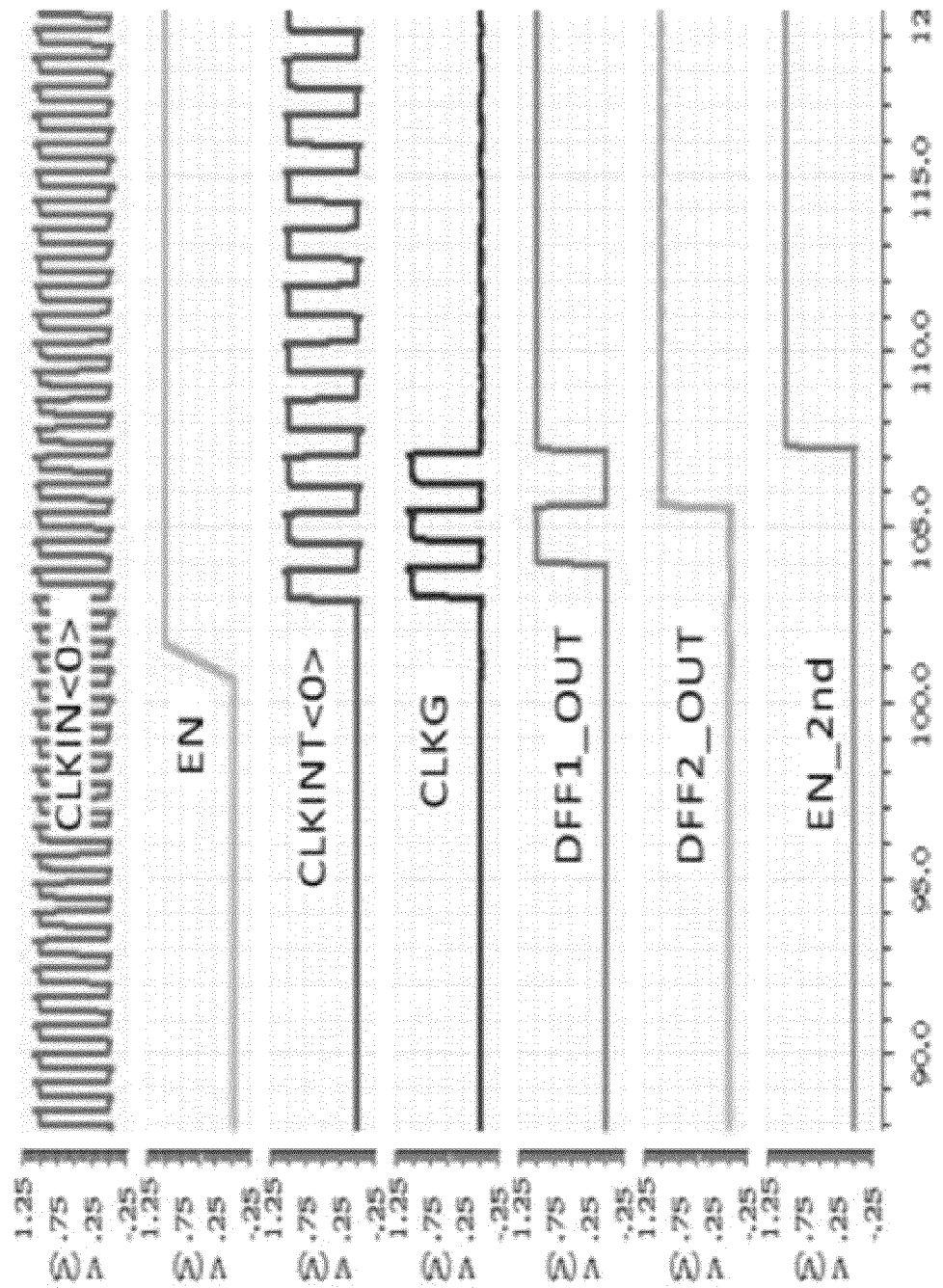
FIG. 16 is a diagram showing waveforms of key signals in an exemplary control circuit suitable for use with the DIV2-4-16 divider of FIG. 14.

As a result, both DFF outputs 728 and 732 will be frozen, and EN_2$^{nd}$ signal 734 will stay at '1' thereafter. This group 720 of logic cells synchronizes the two stages and ensures that the sixteen outputs 715b-c come active in the right order, which is important for the present flying-adder fractional divider. The waveforms of some key signals discussed above are displayed in FIG. 16.

Figure 17:
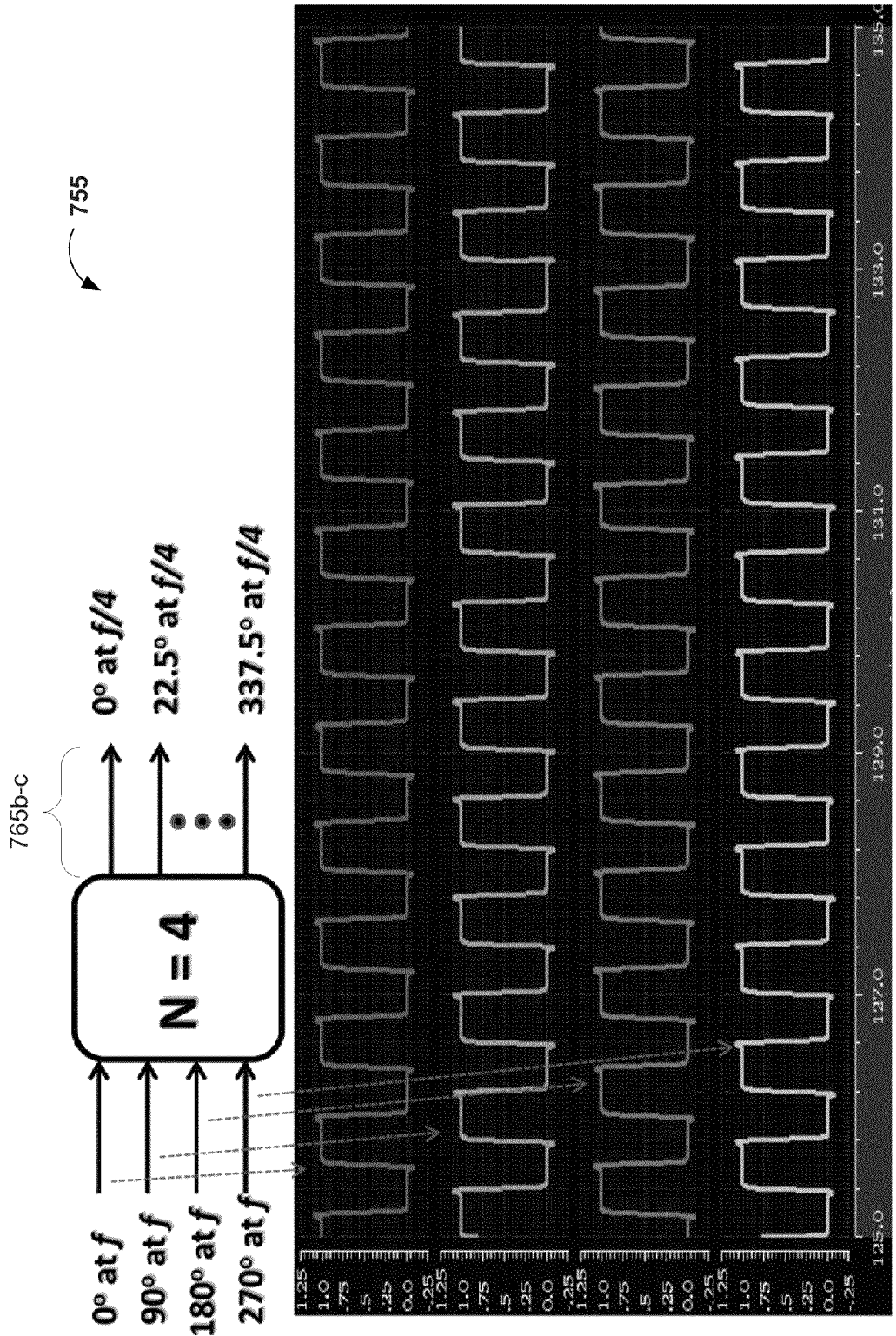
FIG. 17 is a diagram showing four input signals for the exemplary DIV2-4-16 divider of FIG. 14.
Figure 18:
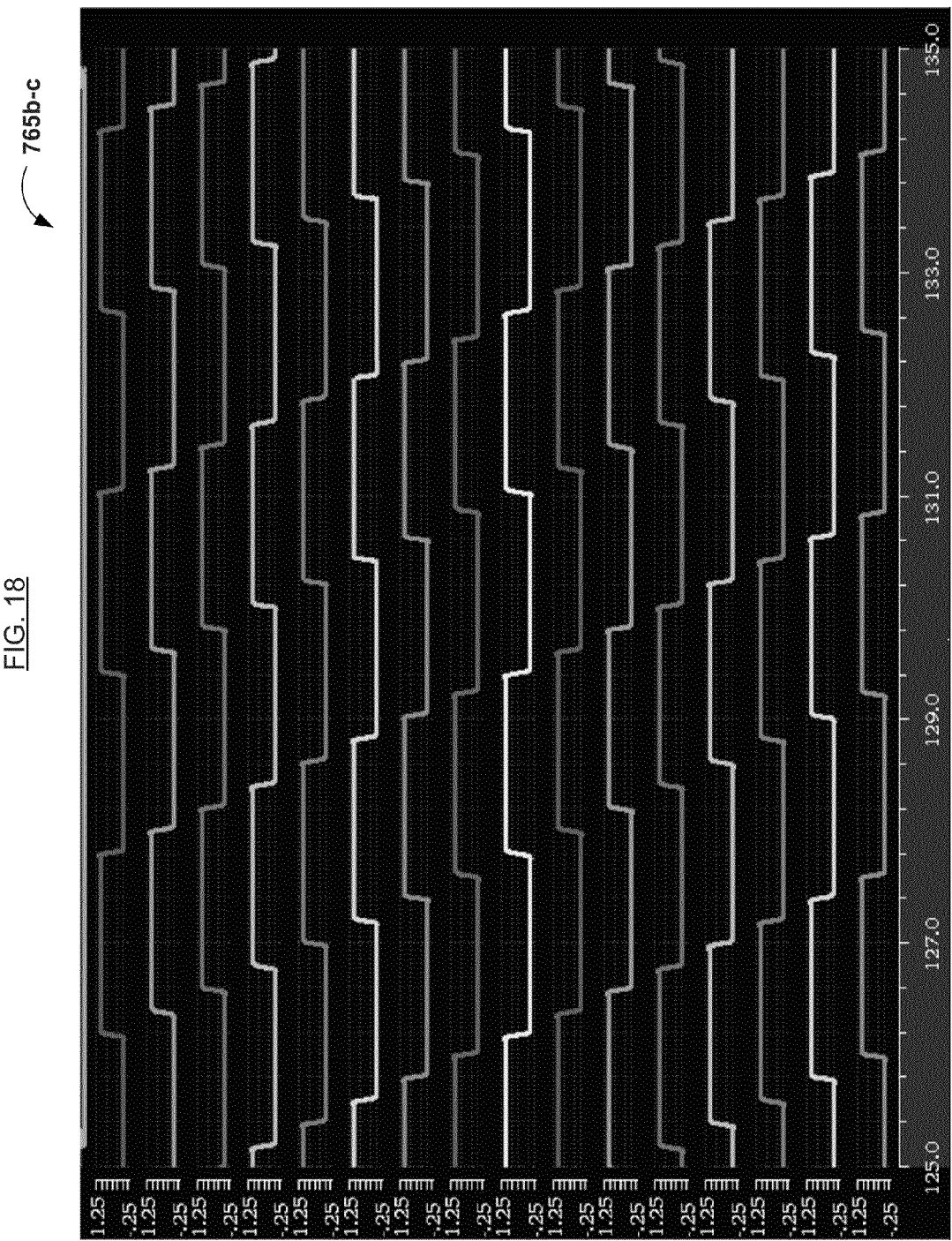
FIG. 18 is a diagram showing the resulting sixteen output signals of the exemplary DIV2-4-16 divider of FIG. 14.

The inputs and outputs of the standard-cell-based DIV2-4-16 divider 700 are shown in FIGS. 17 and 18, respectively. In one example designed using a conventional, commercially available 65 nm semiconductor manufacturing process, the DIV2-4-16 divider 700 uses 0.48 mA of power. Using the cascaded circuits of FIG. 10 and FIG. 14, the total power used is 0.71 mA (0.48+0.23), which is approximately half of the power used by the circuit 600 in FIG. 12 (1.36 mA). The area of the DIV2-4-16 divider 700 is 20 μm by 80 μm.

FIG. 6 shows an exemplary schematic for the flying-adder divider 330-1. Since the divide-by-N divider output is in the range of approximately 300 MHz (as shown in FIG. 9), the flying-adder divider 330-1 may be constructed using digital standard cells. In this design, the MUXs 356a-b, registers 354-1a through 354-3b and adders 352a-b are all designed using digital standard cells, resulting in an area of 30 μm×50 μm, and using 0.23 mA of power when working out 256 MHz, in the conventional, commercially available 65 nm manufacturing process. The divide-by-M=128 divider is constructed by cascading divide-by-2 DFFs, similar to DIV2 circuit 760 in FIG. 15. It is an asynchronous divider for low power, using 9 μA of current and having an area of 25 μm×8 μm in the 65 nm process.

Figure 19:
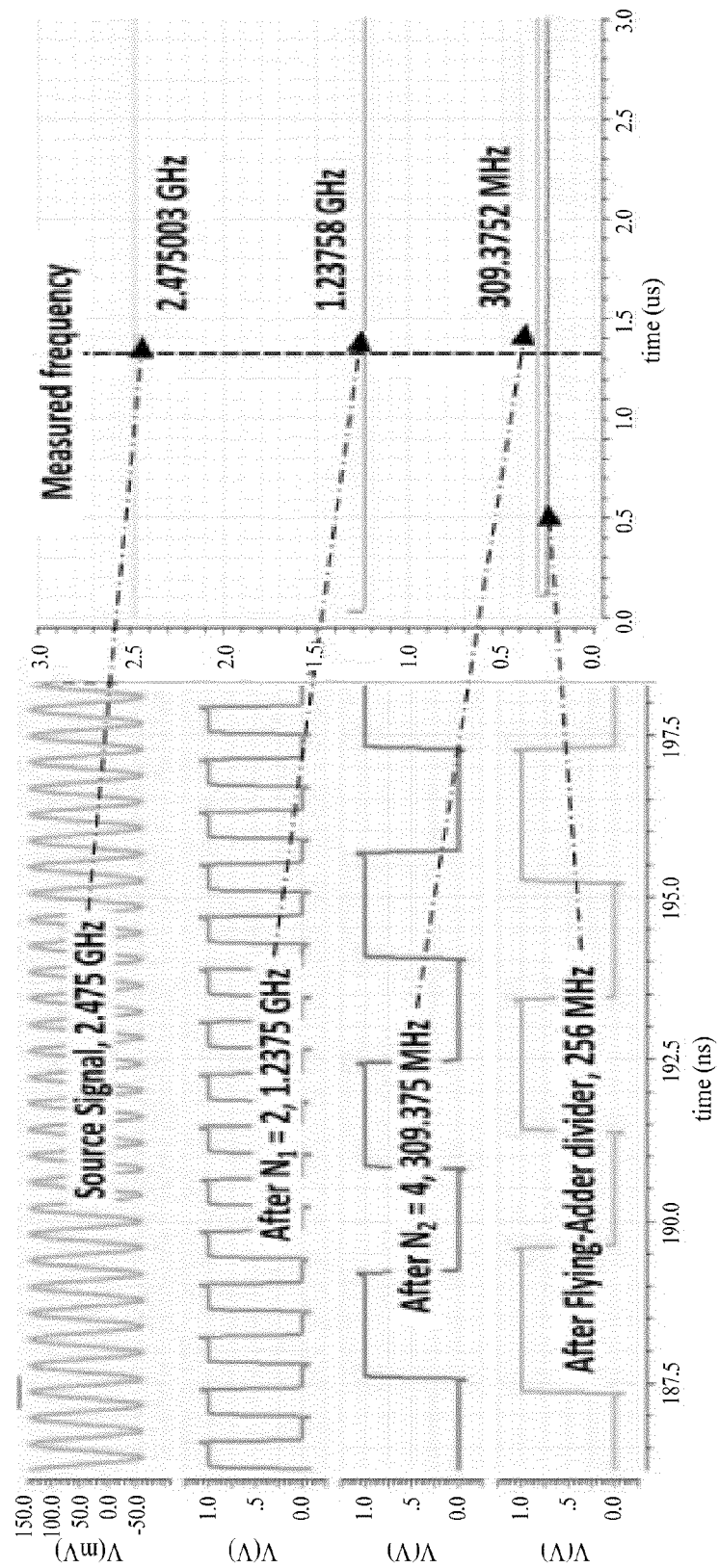
FIG. 19 is a diagram showing exemplary waveforms for key signals of channel 25 in the exemplary ZigBee receiver, and the resulting frequency measurements for some or all of the waveforms shown.
Figure 20:
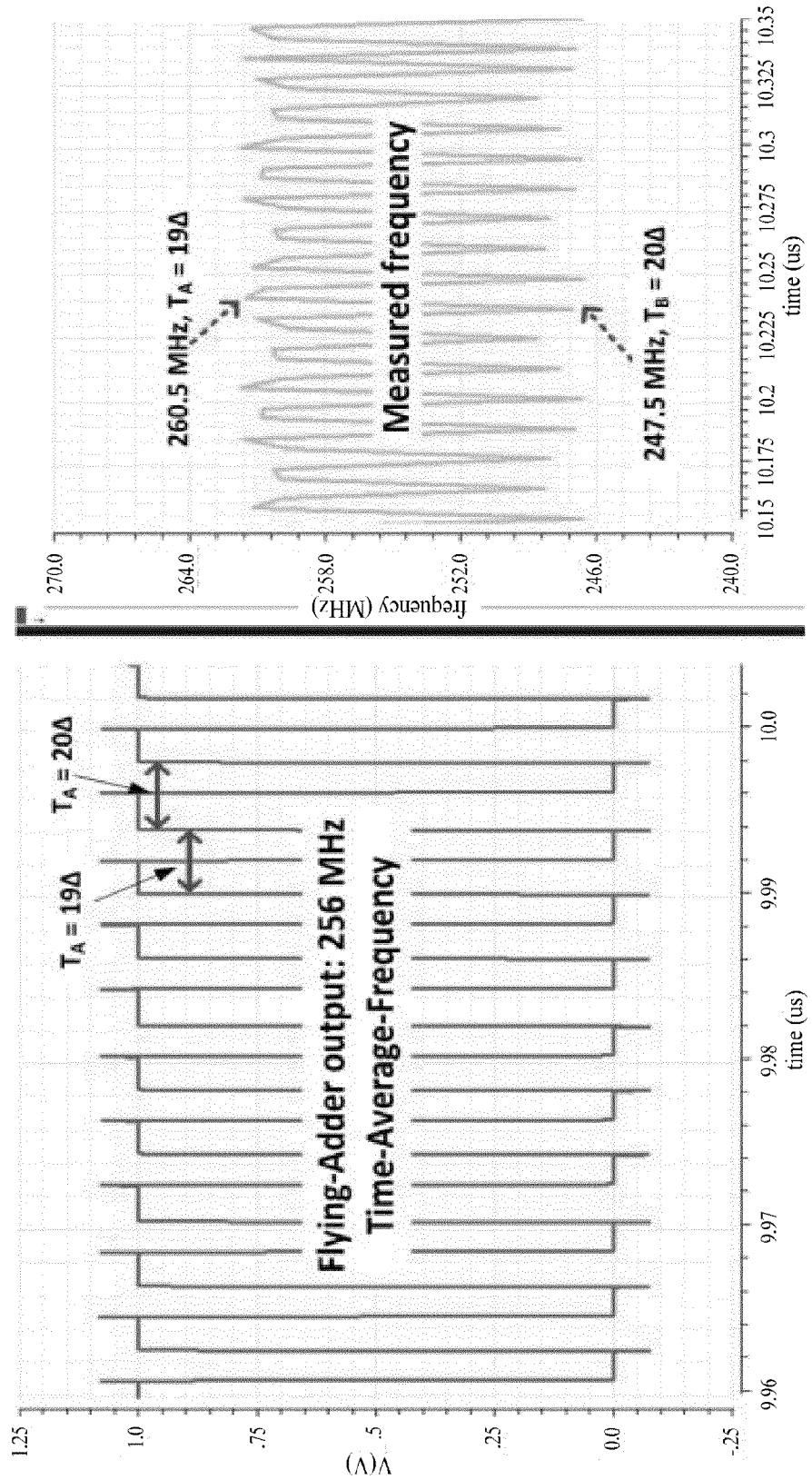
FIG. 20 is a diagram showing exemplary waveforms for the flying-adder output of FIG. 8 and the corresponding frequency measurement.

FIG. 19 shows results of an exemplary transistor-level simulation of channel 25 of the ZigBee receiver referred to in the discussion of FIGS. 7-15 above, including waveforms of certain key signals. The left side of FIG. 19 shows signal waveforms, and the right side of FIG. 19 shows the frequency measurements of the corresponding signals. As previously discussed, the flying-adder output (e.g., signal 435 in FIG. 8) is a Time-Average-Frequency signal in which the desired fractional division may be achieved by using the proper weight between $T_A$ and $T_B$. Referring back to FIG. 9, for channel 25, F=19+43/128. Therefore, $T_A$=19Δ and $T_B$=20Δ, where Δ=Ts/p=202 ps. Therefore, $f_a$=1/$T_A$=260.5 MHz and $f_b$=1/$T_B$=247.5 MHz. For every 128 cycles of clock signal 435, there are 85 $T_A$ cycles and 43 $T_B$ cycles, as shown in FIG. 20.

Figure 21:
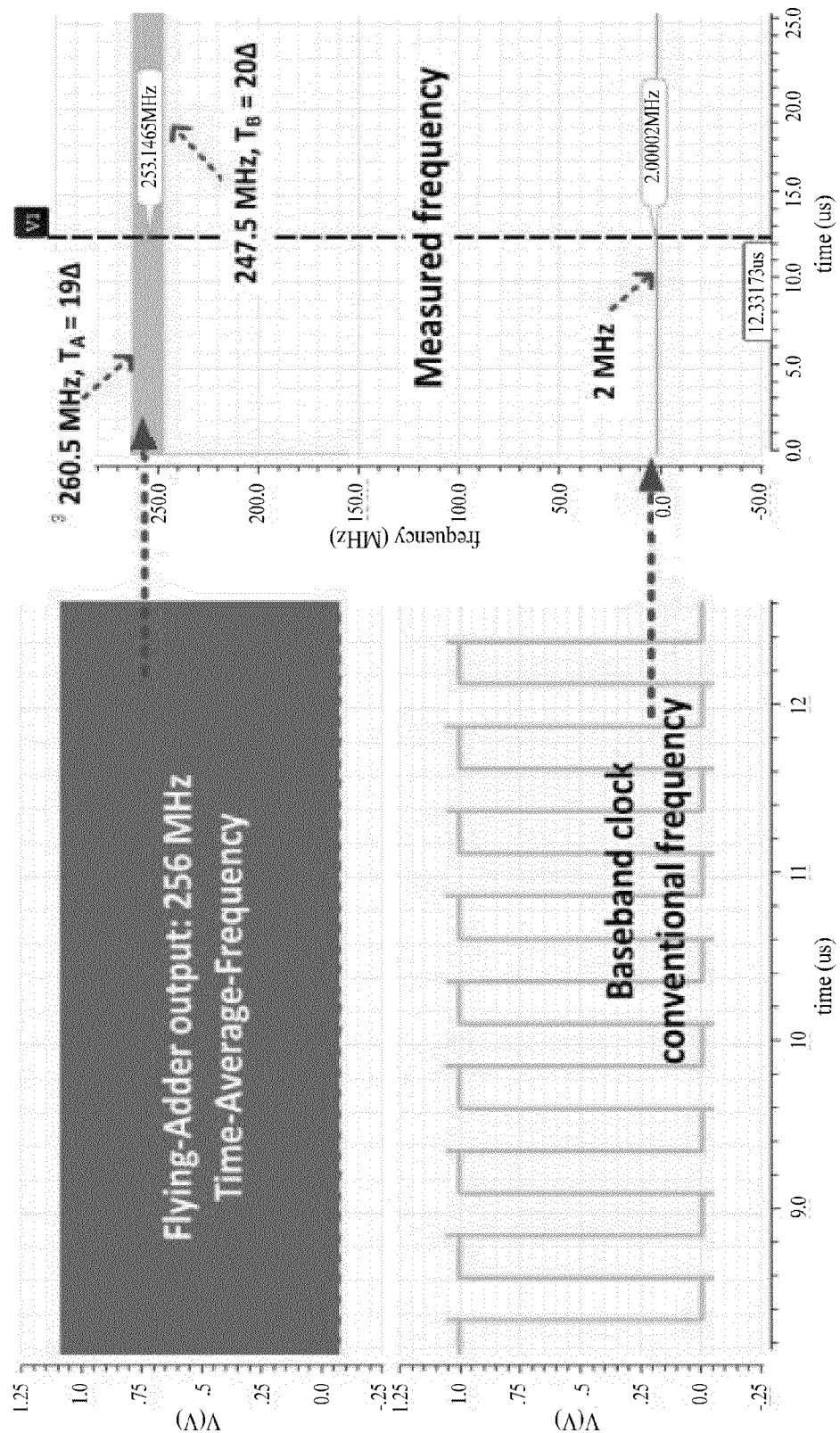
FIG. 21 is a diagram showing exemplary waveforms for the flying-adder output of FIG. 8 and corresponding recovered baseband clock signal.
Figure 22:
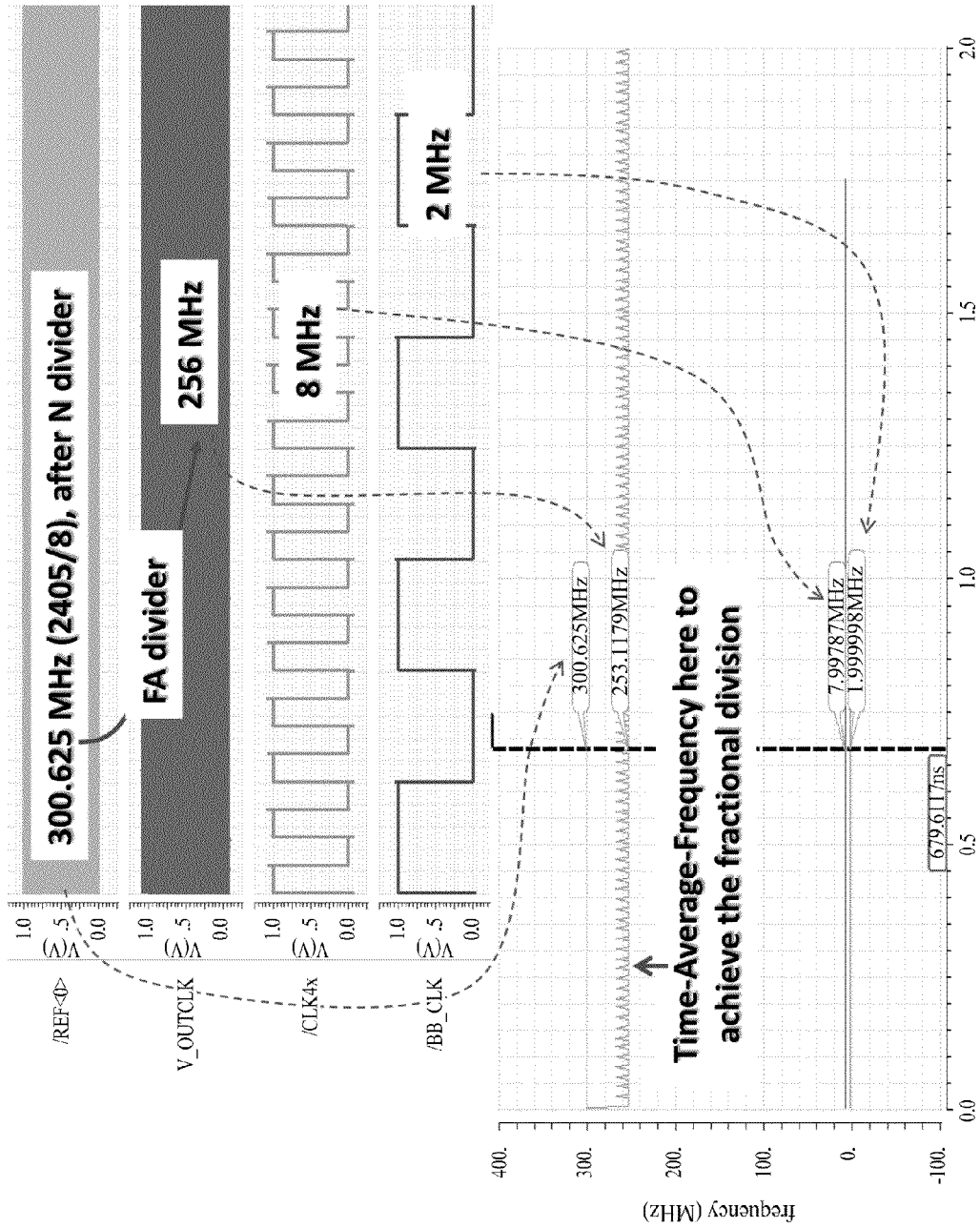
FIG. 22 is a diagram showing waveforms for channel 11 in the exemplary ZigBee receiver, having an input frequency of 2405 MHz.

FIG. 21 shows the flying-adder output and the baseband clock together. The 2 MHz clock is a conventional frequency signal since the fraction $^{43}/_{128}$ is recovered by the M=128 divider (e.g., divider 440 in FIG. 8). FIG. 22 shows another case for channel 11 of the ZigBee receiver. All of the channels in FIG. 9 may be achieved by this system. The total power used is about 1 mW (for all channels), and the area used by this divider is 0.007 mm², in the conventional 65 nm manufacturing technology. Compared to a conventional design that uses injection-locking and that has an average power of 5 mW and area of 0.0276 mm² (also in a conventional 65 nm processing technology), the present flying-adder fractional divider is significantly smaller and more power-efficient.

Figure 23:
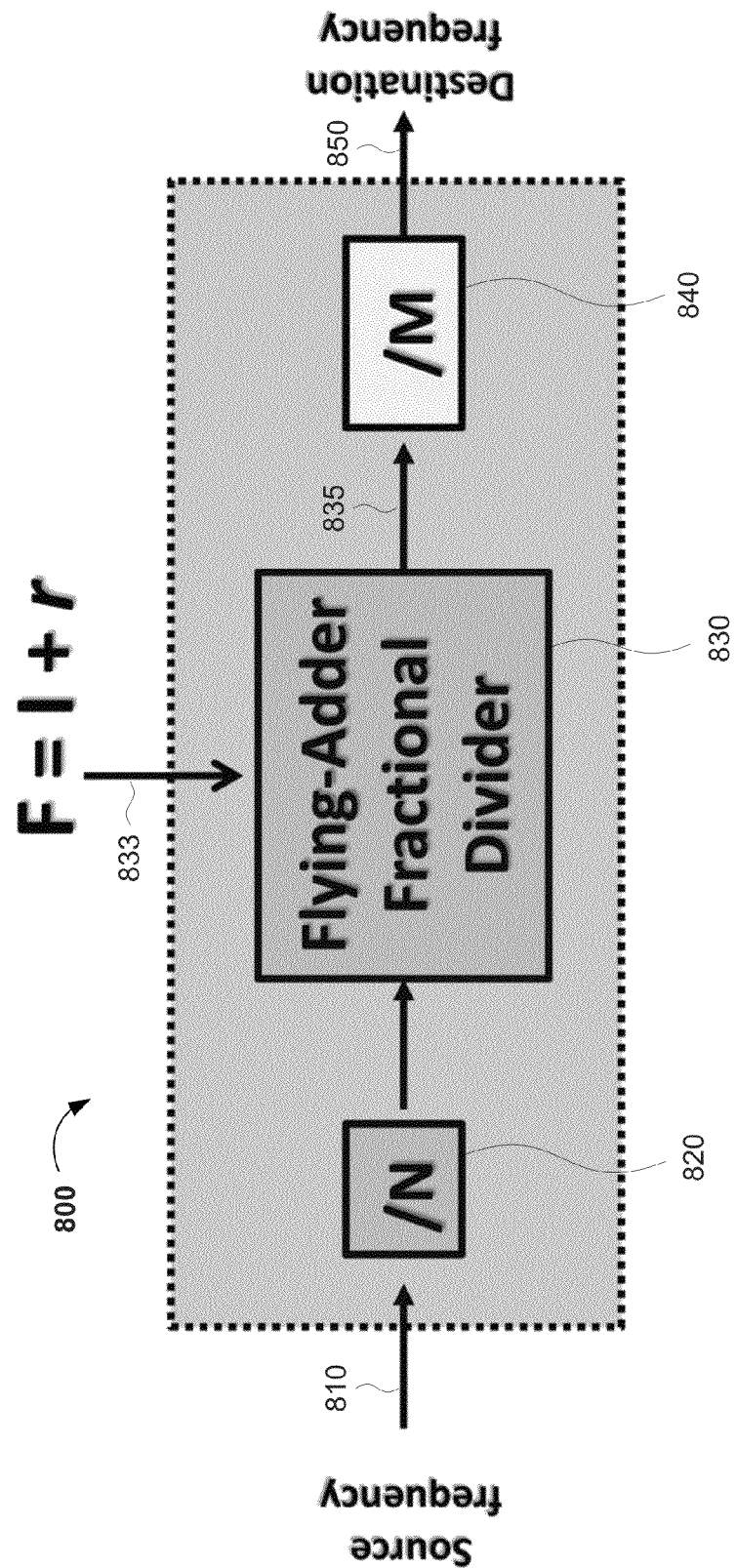
FIG. 23 is a diagram showing a general architecture of the present invention and/or fractional divider.

FIG. 23 shows the present flying-adder fractional frequency division circuit 800 in general, which advantageously provides fractional frequency division without using a feedback loop (e.g., as in a PLL). The source-to-destination frequency division ratio is as expressed in Equation (16) above, but in the case of fractional division circuit 800, PDFR-compatible fractions and non-PDFR-compatible fractions can be used for control word F 833 (which is actually a control word [I+r], where I is the integer part and r is the fractional part of frequency control word F). In this case, the source-to-destination frequency division ratio may have substantially any numeric value. The output frequency from the divider 840 may be a Time-Average-Frequency signal 850 (i.e., two types of cycles $T_A$ and $T_B$ may be used) since non-PDFR-compatible fractions are allowed.

The present invention therefore advantageously provides an open-loop circuit for fractional frequency division (e.g., without using a feedback loop or a PLL). From a source frequency, a first integer frequency divider (e.g., a divide-by-N divider) generates a plurality of signal phases, a flying-adder synthesizer performs the fractional frequency division, and a second integer frequency divider (e.g., a divide-by-M divider) recovers the fractional effect created by the flying-adder synthesizer and generates a signal at the destination frequency having a single period.

Exemplary Methods of Using a Flying-Adder Synthesizer as a Fractional Frequency Divider The present invention further relates to methods of generating a divided clock signal. The method generally comprises (1) dividing an incoming clock signal to produce a first divided clock signal; (2) fractionally dividing the first divided clock signal in accordance with a multi-bit frequency word; and (3) subsequently dividing the fractionally divided clock signal to produce a second divided clock signal. In an exemplary embodiment of the present invention, the second divided clock signal is outputted.

In various embodiments of the present invention, the incoming clock signal has a source frequency, the second divided clock signal has a destination frequency, and the destination frequency is the source frequency divided by (i) an integer of at least one and (ii) a fraction. The integer and the fraction are defined by the multi-bit frequency word.

The first divided clock signal is generated by a first frequency divider, the first frequency divider having a divide-by-N, in which. N is an integer of at least 2. A flying-adder synthesizer divides the first divided clock signal and generates the fractionally divided clock signal. Subsequently, the fractionally divided clock signal is recovered by a second frequency divider. The second frequency divider is a divide-by-M divider, in which M is an integer of at least 2.

CONCLUSION/SUMMARY

Thus, the present invention provides circuitry and methods for integer and fractional frequency division using a flying-adder divider. In wireless transmitter and/or receiver designs, the carrier frequency and the baseband clock frequency should be at a fixed ratio. In conventional systems, such frequencies are generated from a common frequency reference source, and therefore, the divider ratio may be fixed easily. However, in a reference-less (e.g., crystal-less) system, the baseband clock must be directly derived from the carrier. In this kind of system, a challenge arises when the ratio is not an integer. The present invention provides a novel solution to this problem by using a flying-adder synthesizer to achieve the fractional division. In addition, the present invention advantageously provides a significant decrease in cost and power usage, which is important for wireless applications.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A fractional frequency divider, comprising:
a first divider having a divide-by ratio N, the first divider being configured to (i) receive an incoming clock signal and (ii) output a first divided clock signal having a plurality of phases;
a flying-adder circuit configured to (i) fractionally divide said first divided clock signal, and (ii) output a fractionally divided, time-average-frequency clock signal, said flying-adder circuit comprising a multiplexer receiving said first divided clock signal and outputting one of said phases of said first divided clock signal, one or more registers configured to store a multi-bit value that selects said one of said phases of said first divided clock signal output by said multiplexer, and an adder or accumulator that adds a frequency control word to the multi-bit value in the register, the frequency control word F having an integer part and a fractional part, and the time-average-frequency clock signal having one or more cycles of a first length and one or more cycles of a second length; and
a second divider having a divide-by ratio M, M being an integer of at least 2, the second divider being configured to (i) receive said fractionally divided clock signal, and (ii) output a second divided clock signal having only cycles of a single length, wherein for every M cycles of the time-average-frequency clock signal, the fractional part of the frequency control word defines a number of cycles of the first length and the second length.

2. The fractional frequency divider of claim 1, wherein said incoming clock signal has a source frequency, said second divided clock signal has a destination frequency, and said destination frequency is said source frequency divided by (i) an integer of at least one and (ii) a fraction.

3. The fractional frequency divider of claim 1, wherein N is an integer of at least 2, said first divided clock signal comprises K phases, where K is an integer multiple of N, said multi-bit value comprises an integer part and a fractional part, and said integer part of said multi-bit value selects said one of said K phases of said first divided clock signal.

4. The fractional frequency divider of claim 3, wherein said plurality of phases are separated from each other by $2\pi/K$ degrees, K being an integer of at least 2.

5. The fractional frequency divider of claim 3, wherein said flying-adder circuit receives said plurality of phases and produces said fractionally divided clock signal from said plurality of phases, and said flying-adder circuit further comprises a flip-flop receiving said one of said phases of said first divided clock signal output by said multiplexer and providing said fractionally divided clock signal.

6. The fractional frequency divider of claim 5, wherein said flying-adder circuit produces said fractionally divided clock signal by selecting said one of the plurality of phases at any given moment in accordance with said frequency control word.

7. The fractional frequency divider of claim 6, having a division ratio $f_s/f_d = F*N*M/K$, where F is a numerical value represented by said frequency control word, the numerical value includes a fraction defined by the fractional part of the frequency control word, N is an integer of $2^x$, x is a positive integer, $f_s$ is the source frequency of said incoming clock signal, and $f_d$ is a destination frequency of said second divided clock signal.

8. The fractional frequency divider of claim 7, wherein F=I +x/M, I is an integer of at least 1, x is an integer of at least 1, x<M, and x/M is the fractional part of said frequency control word.

9. The fractional frequency divider of claim 1, wherein said first frequency divider comprises a divide-by-N divider, and said second frequency divider comprises a divide-by-M divider, where N is an integer of $2^x$, and x is a positive integer.

10. The fractional frequency divider of claim 1, wherein said flying-adder circuit further comprises a second multiplexer receiving said first divided clock signal, one or more second registers configured to store a second multi-bit value that selects said a same or different one of said phases of said first divided clock signal to be output by said second multiplexer at a given moment within a cycle of the fractionally divided clock signal, a second adder or accumulator that adds a second frequency control word to the second multi-bit value in the second register, a third multiplexer configured to select one of the outputs of said first and second multiplexers, and a flip-flop receiving the selected one of the outputs of said first and second multiplexers and providing said fractionally divided clock signal.

11. The fractional frequency divider of claim 1, wherein the fractional part of said frequency control word is expressed as x/M, where x and M are each integers and x<M, and said time-average-frequency clock signal has x cycles of said first length and (M−x) cycles of said second length for every M cycles of the time-average-frequency clock signal.

12. A method of generating a divided clock signal, comprising:
dividing an incoming clock signal by a first ratio N to produce a first divided clock signal having a plurality of phases;
fractionally dividing the first divided clock signal in accordance with a multi-bit frequency control word having an integer part and a fractional part to generate a time-average-frequency clock signal, wherein fractionally dividing the first divided clock signal comprises receiving said plurality of phases of said first divided clock signal in a multiplexer, adding the multi-bit frequency control word to a multi-bit value having an integer part and a fractional part in one or more registers, selecting one of said phases of said first divided clock signal in the multiplexer using the multi-bit value in the one or more registers, and the time-average-frequency clock signal has one or more cycles of a first length and one or more cycles of a second length; and
dividing the fractionally divided time-average-frequency clock signal by a second ratio M to produce a second divided clock signal having only cycles of a single length, wherein M is an integer of at least 2, and for every M cycles of the time-average-frequency clock signal, the fractional part of the frequency control word defines a number of cycles of the first length and the second length.

13. The method of claim 12, wherein the incoming clock signal is divided by a ratio N, N is an integer of at least 2, said first divided clock signal comprises a number of phases that is an integer multiple of N, said multi-bit value comprises an integer part and a fractional part, and said integer part of said multi-bit value selects said one phase of said first divided clock signal.

14. The method of claim 13, wherein said incoming clock signal has a source frequency, said second divided clock signal has a destination frequency, and said destination frequency is said source frequency divided by (i) an integer of at least one and (ii) a fraction.

15. The method of claim 14, wherein the integer and the fraction are defined by F*N*M/K, where F is a numerical value represented by the multi-bit frequency control word, the numerical value includes a fraction defined by the fractional part of the frequency control word, N is an integer of $2^x$, x is a positive integer, M is independently an integer of at least 2, and K is the number of phases of the first divided clock signal.

16. The method of claim 12, wherein said first divided clock signal is fractionally divided by a flying-adder circuit comprising said multiplexer, said one or more registers, and an adder or accumulator that adds the frequency control word to the multi-bit value in the register.

17. The method of claim 12, wherein said fractionally divided time-average-frequency clock signal is divided by a second frequency divider comprising a divide-by-M divider, and said first divided clock signal is generated by a first frequency divider having a divide-by ratio of N, where N is an integer of $2^x$, and x is a positive integer.

18. The method of claim 12, wherein the fractional part of said multi-bit frequency control word is expressed as x/M, where x and M are each integers and x<M, and said time-average-frequency clock signal has x cycles of said first length and (M−x) cycles of said second length for every M cycles of the time-average-frequency clock signal.

* * * * *